(12) United States Patent
Zhuang et al.

(10) Patent No.: US 10,661,308 B2
(45) Date of Patent: May 26, 2020

(54) HIGH DISPLACEMENT ULTRASONIC TRANSDUCER

(71) Applicant: KOLO MEDICAL, LTD., San Jose, CA (US)

(72) Inventors: Xuefeng Zhuang, San Jose, CA (US); Yongli Huang, San Jose, CA (US); Dave Hong, Los Altos, CA (US); Lei Chen, Santa Clara, CA (US)

(73) Assignee: KOLO MEDICAL, LTD., San Jose, CA (US)

( * ) Notice: Subject to any disclaimer, the term of this patent is extended or adjusted under 35 U.S.C. 154(b) by 211 days.

(21) Appl. No.: 15/817,360

(22) Filed: Nov. 20, 2017

(65) Prior Publication Data

US 2018/0085785 A1 Mar. 29, 2018

Related U.S. Application Data

(62) Division of application No. 14/444,187, filed on Jul. 28, 2014, now Pat. No. 9,821,340.

(51) Int. Cl.
*B06B 1/02* (2006.01)
*B81B 3/00* (2006.01)

(52) U.S. Cl.
CPC ............ *B06B 1/0292* (2013.01); *B81B 3/007* (2013.01); *B81B 3/0037* (2013.01); *B81B 2201/0257* (2013.01); *B81B 2203/0109* (2013.01); *B81B 2203/0163* (2013.01); *B81B 2203/0307* (2013.01)

(58) Field of Classification Search
CPC .................. B06B 1/0292; B81B 3/007; B81B 2203/0109; B81B 2201/0257; B81B 2203/0163; B81B 3/0037; B81B 2203/0307

See application file for complete search history.

(56) References Cited

U.S. PATENT DOCUMENTS

| | | | |
|---|---|---|---|
| 6,433,657 B1 | 8/2002 | Chen | |
| 6,640,642 B1* | 11/2003 | Onose | G01L 1/146 73/718 |
| 6,657,525 B1 | 12/2003 | Dickens | |
| 6,844,960 B2 | 1/2005 | Kowarz | |
| 6,949,996 B2 | 9/2005 | Matsumoto | |
| 7,027,284 B2 | 4/2006 | Kobayashi | |
| 7,265,477 B2 | 9/2007 | Wan | |
| 7,489,593 B2* | 2/2009 | Nguyen-Dinh | B06B 1/0292 367/181 |

(Continued)

FOREIGN PATENT DOCUMENTS

| | | |
|---|---|---|
| JP | 2006147995 | 6/2006 |
| WO | WO2001046741 | 6/2001 |

*Primary Examiner* — Syed I Gheyas
(74) *Attorney, Agent, or Firm* — Mattingly & Malur, PC

(57) ABSTRACT

In some examples, a method of fabricating a transducer includes disposing a plurality of anchors on a substrate and disposing a sealing material and a device layer over the anchors and the substrate to form a cavity, the sealing material sealing the cavity. The method may further include forming, in the device layer, a plate and at least one spring member. The at least one spring member may be supported by at least one anchor of the plurality of anchors, and the at least one spring member may support the plate to allow relative movement between the plate and the substrate.

17 Claims, 22 Drawing Sheets

(56) References Cited

U.S. PATENT DOCUMENTS

| | | |
|---|---|---|
| 8,344,470 B2 | 1/2013 | Sampsell |
| 2002/0005341 A1 | 1/2002 | Seki |
| 2002/0149294 A1 | 10/2002 | Matsumoto |
| 2005/0146241 A1 * | 7/2005 | Wan .................. H02N 1/006 310/309 |
| 2010/0232257 A1 | 9/2010 | Tanaka |
| 2011/0205197 A1 | 8/2011 | Sampsell |
| 2013/0264663 A1 | 10/2013 | Dehe |
| 2014/0092110 A1 | 4/2014 | Chan |

* cited by examiner

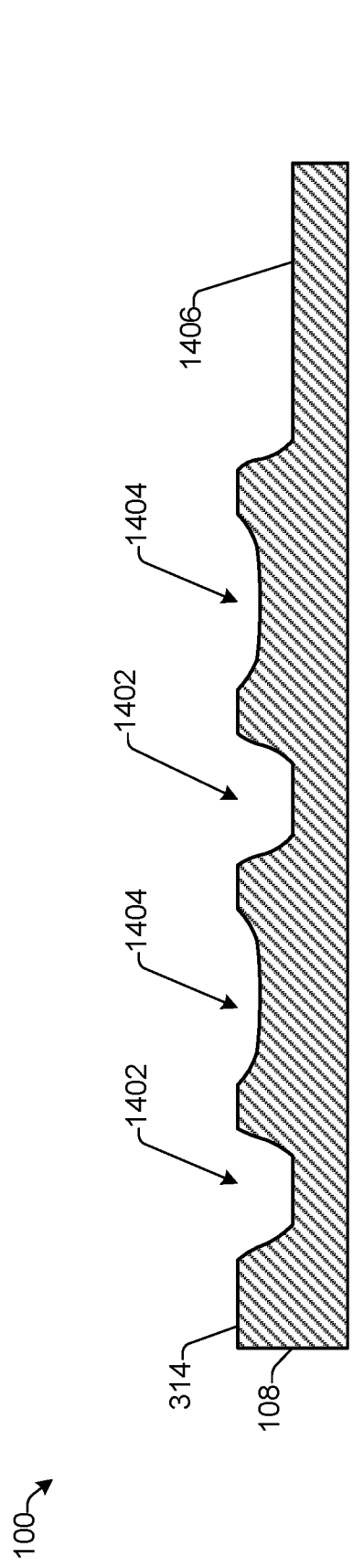
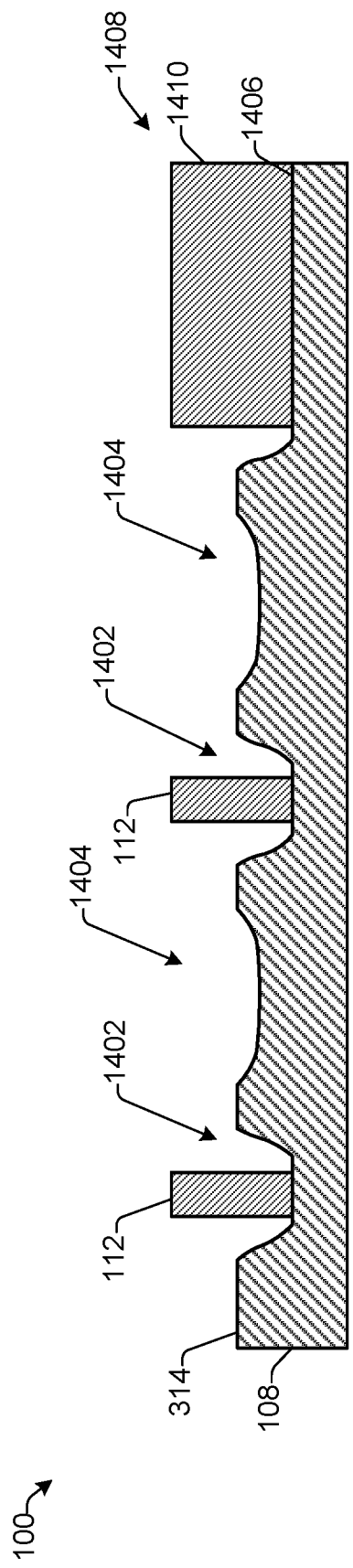
FIG. 14A
FIG. 14B

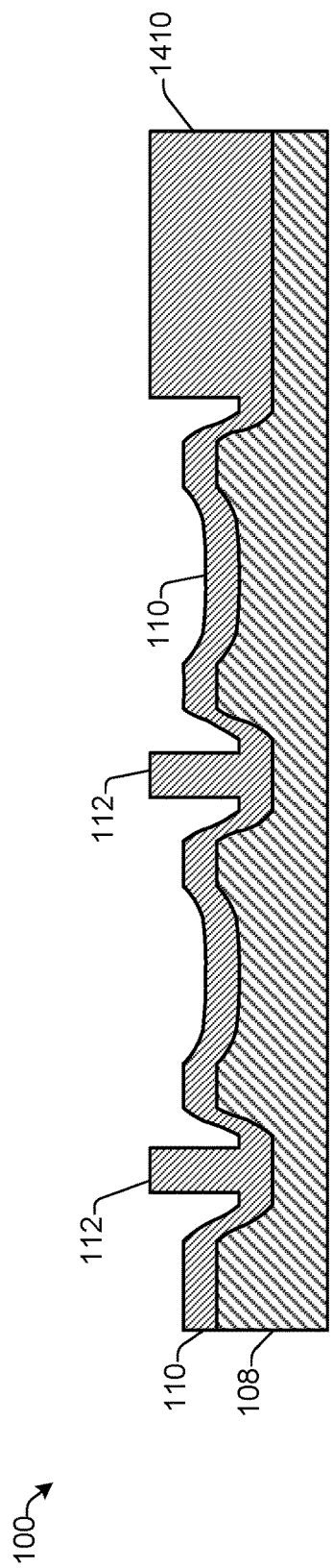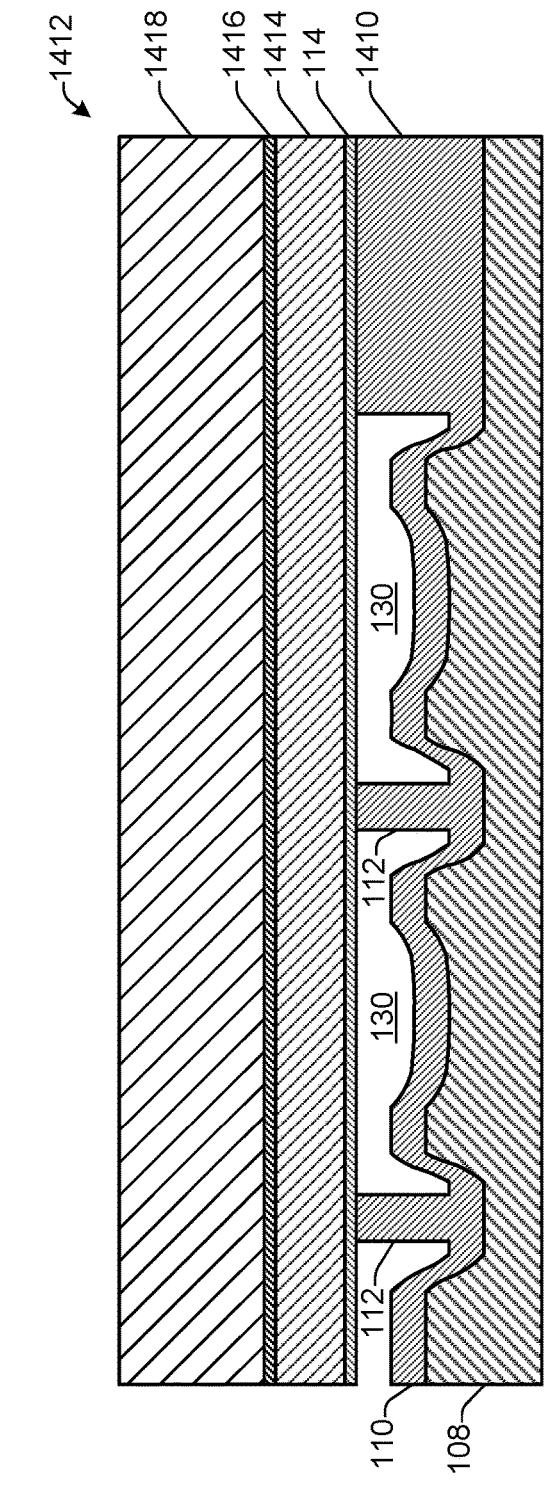

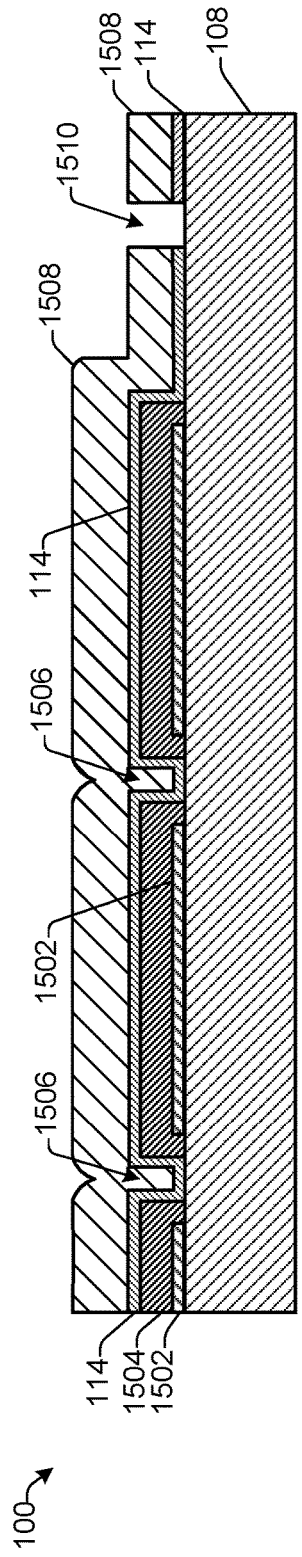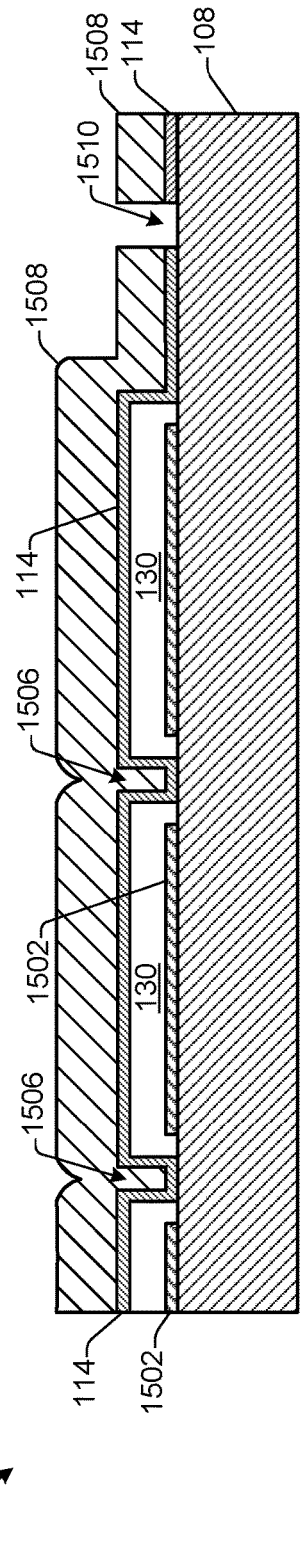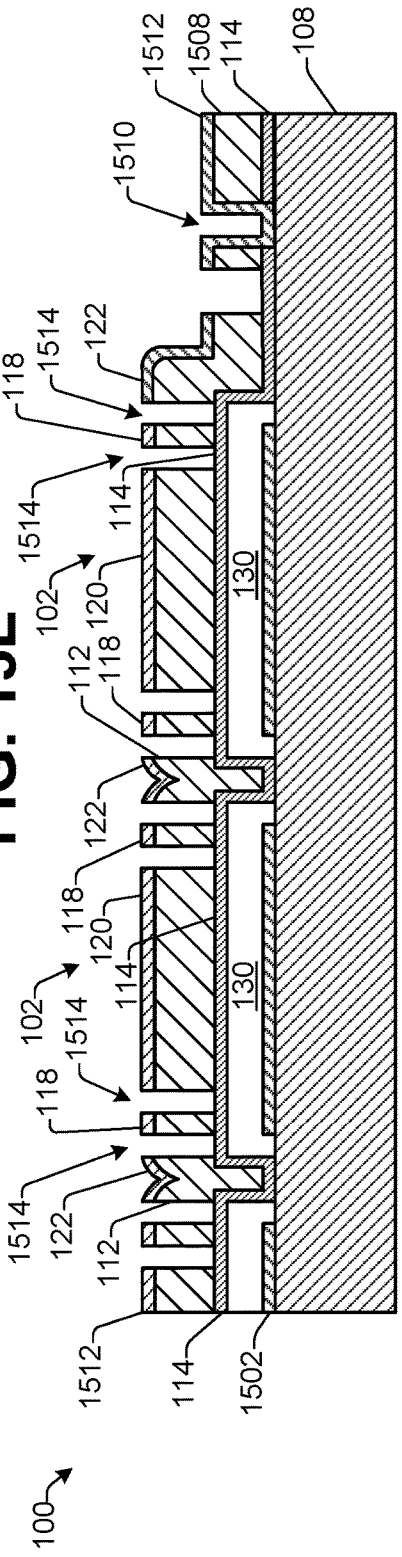

HIGH DISPLACEMENT ULTRASONIC TRANSDUCER

CROSS-REFERENCE TO RELATED APPLICATION

This application is a divisional application of, and claims priority to, U.S. patent application Ser. No. 14/444,187, filed Jul. 28, 2014, now U.S. Pat. No. 9,821,340, which is incorporated by reference herein in its entirety.

TECHNICAL FIELD

This disclosure relates to the technical field of ultrasonic transducers and transducer arrays, such as capacitive micromachined ultrasonic transducers (CMUTs) and CMUT arrays.

BACKGROUND

Electrostatic actuators and ultrasonic transducers may be used for various applications in a variety of media including liquids, solids, and gas. For instance, ultrasonic transducers are commonly used in the medical field, such as for imaging, diagnostics, and therapy. Other uses may include biochemical imaging, non-destructive evaluation of materials, sonar, communications, proximity sensing, gas flow measurements, in-situ process monitoring, acoustic microscopy, underwater sensing and imaging, and numerous other practical applications.

An ultrasonic transducer having an electrostatic mechanism may be referred as a capacitive ultrasonic transducer. A capacitive ultrasonic transducer fabricated using micromachining techniques may be referred to as a capacitive micromachined ultrasonic transducer (CMUT). A typical CMUT may include at least two electrodes and a transducing space (e.g., a separation gap) between the two electrodes that allows one of the electrodes to be physically displaced toward and away from the other electrode during operation. For example, some CMUTs may include a flexible membrane that allows displacement of one or more of the electrodes. However, the displacement capability of such membranes may be limited due to various factors, such as the materials used, the physical configurations of the membranes and the CMUTs in which they are employed, and so forth.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

FIGS. 14A-14F illustrate a side cross-sectional view of a transducer apparatus during select fabrication operations according to some implementations.

FIGS. 15A-15F illustrate a side cross-sectional view of a transducer apparatus during select fabrication operations according to some implementations.

DESCRIPTION OF THE EMBODIMENTS

Figure 1:
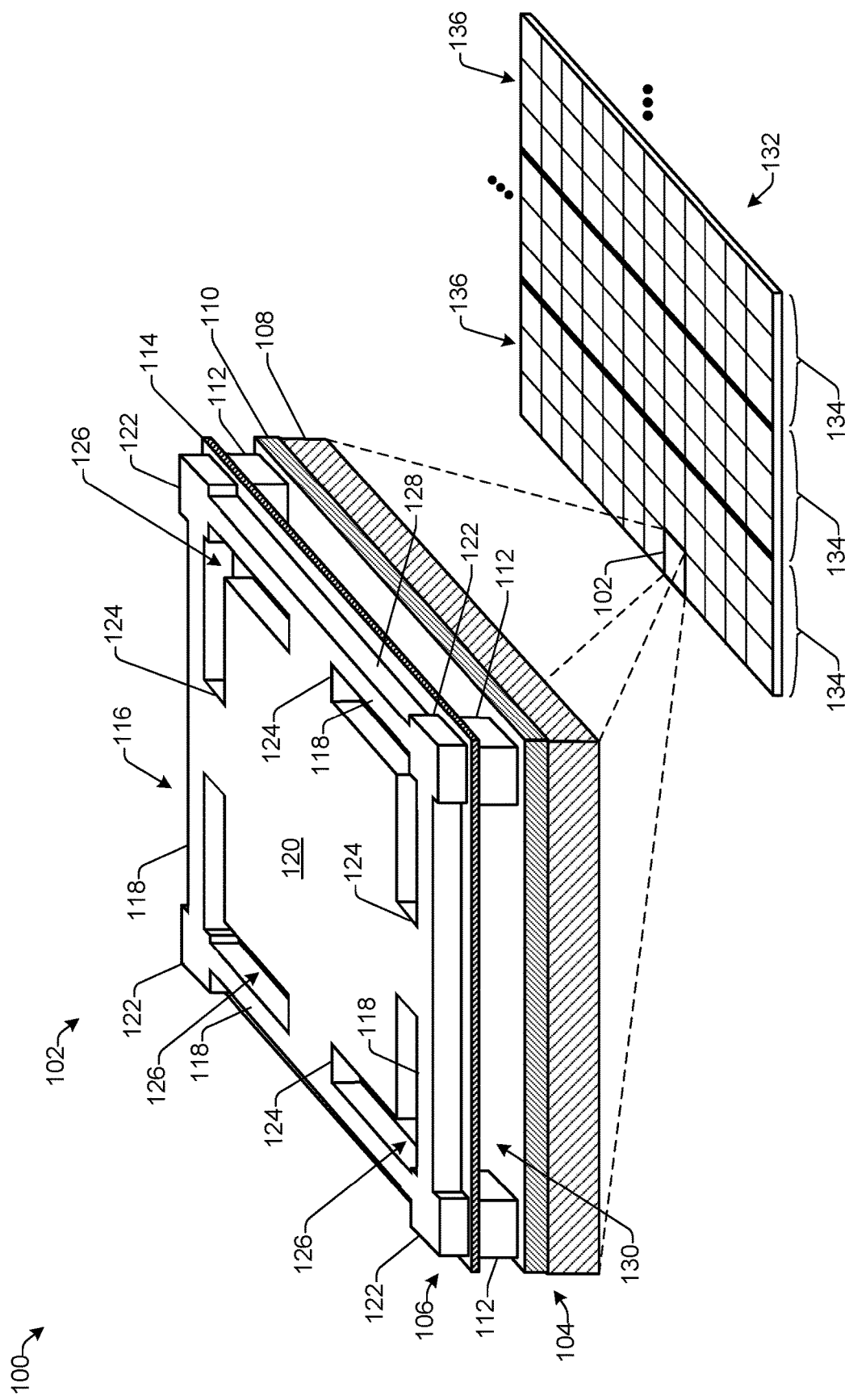
FIG. 1 illustrates a perspective view of an example of a cell of a transducer apparatus according to some implementations.

This disclosure includes techniques and arrangements for a transducer apparatus that includes a spring structure that enables a large, consistent amount of displacement of a transducer element. For example, an individual cell of the transducer apparatus may include a substrate having a first electrode portion, with at least one post or other suitable spring anchor extending from a first side of the substrate. At least one spring member may be supported by the at least one anchor, and may be connected to a plate that includes a second electrode portion. Accordingly, the spring member suspends, or otherwise supports the plate, at least in part, for enabling the plate to move in a resilient manner toward and away from the substrate.

In some implementations, the at least one spring member may be a beam spring, a leaf spring, or other type of bar-shaped spring that is supported by the at least one anchor. As one example, the spring member may be supported between a pair of anchors e.g., with one anchor supporting each end of the spring member. In other examples, the spring member may be cantilevered from a single anchor. In addition, in some instances, an individual cell of the transducer apparatus may include two, four, or more, anchors that support multiple spring members, which in turn support the plate that includes the second electrode portion. As one example, the plate may be shaped as a square or other rectangle, or any of various other shapes, such as circular, hexagonal, triangular, and so forth. In the case that the plate is a rectangle, there may be a spring member disposed on each of the four sides of the plate, such as configured in a rectangular pattern around the plate. Furthermore, in some cases, the springs and the plate may be fabricated from a single piece of material, such as by etching, deposition or other suitable micromachining techniques. Accordingly, various micromachining methods may be used to fabricate the transducer apparatus herein, such as etching (e.g., sacrificial etching, surface micromachining), wafer bonding, deposition, combinations thereof, or any other suitable fabrication techniques that are known or that may become known.

In some instances, the first electrode portion may serve as a first electrode of a capacitive micromachined ultrasonic transducer (CMUT), and the second electrode portion may serve as a second electrode of the CMUT. In addition, a transducing gap may exist between the plate and the substrate, such that a capacitance may exist between the first electrode and the second electrode. Changes in the transducing gap, e.g., changes in the distance of the plate from the substrate, may correspond to changes in the capacitance between the first electrode and the second electrode. For instance, the CMUT may be a generally parallel plate capacitor in which the second electrode is movable towards and away from the first electrode through flexing of the at least one spring member. The electrodes may be used to transmit (TX) or receive (RX) an acoustic wave in an adjacent medium. In some examples, a DC bias voltage may be applied between the electrodes to provide a baseline deflection of the plate to an optimum position for CMUT operation, typically with the goal of maximizing sensitivity and/or bandwidth.

During transmission an electrical signal, such as an AC signal, may be applied to the CMUT by an electronic circuit. The alternating electrostatic force between the first electrode and the second electrode causes the plate to move towards and away from the substrate (e.g., vibrate), and thereby deliver acoustic energy into a medium adjacent to the CMUT. During reception, incoming acoustic energy may impinge on the plate thereby moving the plate toward and away from the substrate i.e., moving the second electrode toward and away from the first electrode, thus altering the capacitance between the two electrodes. The changes in capacitance may be detected by an electronic circuit and the resulting electric signal may be analyzed or otherwise processed to determine characteristics of the incoming acoustic energy.

In some examples herein, the bottom substrate and/or the upper plate material may be conductive. For instance, if the substrate itself is conductive, then the substrate may serve as the first electrode. Similarly, if the material from which the plate is constructed is conductive, then the plate itself may serve as the second electrode. In other examples, conductive material may be patterned or otherwise deposited onto the substrate to form the first electrode. As another example, one or more select areas of the substrate may be doped to make the one or more areas conductive, while a remainder of the substrate may remain dielectric or nonconductive. Similarly, if the plate is not made of a conductive material, the second electrode may be patterned onto the bottom or the top of the plate, the plate may be doped to make the plate conductive, and so forth.

As mentioned above, the transducer apparatus includes a transducing gap, which includes a cavity between the plate and the substrate. In some examples, the transducer apparatus further comprises a sealing layer to seal, at least in part, the cavity. For instance, the cavity may be sealed so that liquid, gas or other substance is not able to enter into the cavity, such as in the case in which transducing apparatus is submerged into a liquid. Additionally, in some examples, a vacuum may be applied within the gap, or the gap may be filled with an inert gas, such as nitrogen, and the sealing material may be non-conductive. As one example, the sealing member can be a thin film layer of sealing material positioned below or above the plate(s) and/or spring member(s). As another example, the sealing material may be placed within any openings between the spring member(s) and the plate(s). For instance, the sealing material may be relatively flexible (e.g., more flexible than the spring members and the plate), so that sealing material has minimal effect on the displacement difference between adjacent CMUT components (e.g., spring member(s), plate(s) and anchor(s)). In some examples, the sealing member may be a single layer of sealing material. In other examples, the sealing material may include multiple layers, which may be contiguous or non-contiguous with each other.

In the examples herein, the spring members may be more flexible than the plate, so that the plate has relatively larger and consistent displacement during operation of the CMUT. For instance, the spring member(s) may be substantially more flexible than the plate so that the movement of an active surface of the CMUT is primarily due to deformation of the spring structure rather than the plate. Consequently, there may be relative displacement between the spring member(s) and the plate, and sealing material may be disposed so as to seal the openings among the spring structure, the anchor(s) and the plate (i.e., openings between the spring structure and plate, between the spring structure and the anchor(s), between the anchor(s) and the plate, etc.) to help keep the cavity sealed, such as for maintaining a vacuum within the cavity.

In some implementations, the transducer apparatus may include multiple basic structure units or cells. As one example, a plurality of the cells may be fabricated together, e.g., in a side-by-side configuration, such as to form an array element of the transducer apparatus, and a plurality of the array elements may be fabricated concurrently, e.g., in a side-by-side configuration, such as to form an array of the transducer apparatus. Alternatively, in other examples, any arrangement of a plurality of cells may form an array. As mentioned above, each cell may include a substrate, one or more anchors to support the spring structure, the plate, the sealing material, two electrodes, and a cavity sealed underneath the plate to provide a transducing gap between the plate and the substrate. The cells in the CMUT can be the same as each other or different from each other. In some examples, one or more of the cells may share a spring structure or/and an anchor with one or more neighboring cells. Furthermore, in some cases, each cell may have an individually sealed cavity, or alternatively, multiple cells have connected cavities that are sealed together. Accordingly, the cavity may be sealed by the plate, the spring structure, the sealing material, the spring anchor(s) and/or the substrate.

The spring structure may connect to any suitable position on the plate. As one example, an individual spring member may connect to the plate at an edge of the plate. In addition, the spring structure may be arranged around the perimeter of the edge of the cell to maximize the average displacement of the plate within the cell. In some examples, the thickness of an individual spring member may be controlled to be approximately the same as that of the plate. As one particular example, the spring member may have an approximately square or similar rectangular cross-section. In other examples, the spring member may have a circular cross-section, a triangular cross-section, an I-beam cross-section, an L-shaped cross-section, a T-shaped cross-section, or any other suitable cross-section. Additionally, in some examples, plugs may be applied to one or more of the anchors to enhance the strength of the connection of individual spring members to the anchors. For example, the plug may be inserted into a via or other opening formed in the spring member and the anchor.

Furthermore, in some examples, the spring structure and the plate may share at least one layer of the same material. Additionally, or alternatively, in some examples, the spring structure and the plate may be fabricated from a single piece of material, such as from a single contiguous substrate. The plate of the transducer apparatus may have a uniform thickness or a variable thickness. As one example of a plate with variable thickness, the plate may include an enhancement structure, such as one or more stiffening elements, so that the plate has the improved rigidity, with less mass, than a plate of comparable mass and material having a uniform thickness. Furthermore, the plate (or the entire cell) can have any of numerous different shapes such as square, rectangular, circular, hexagonal, triangular, or any other desired shape.

Some examples herein are described in the context and environment of a CMUT for transmitting and receiving ultrasonic energy. However, implementations herein are not limited to the examples described, and may be extended to other contexts and other environments, as will be apparent to those of skill in the art having the benefit of the disclosure herein.

FIG. 1 illustrates a perspective view of an example basic structural unit of a transducer apparatus 100 according to some implementations. In some instances, the basic structural unit of the transducer apparatus may be referred to as a cell 102, and a plurality of the cells 102 may be arranged adjacent to each other to form at least a portion of an array, as described elsewhere herein. In the illustrated example, the cell 102 includes a lower structure 104 and an upper structure 106. The lower structure 104 includes a substrate 108, an optional insulation layer 110, and one or more spring anchors 112. For example, a plurality of anchors 112 may extend from the upper side of the substrate 108. In some instances, the anchors 112 may be shaped as posts, and may be made from a non-conductive material, such as an oxide or the like, as discussed additionally below. In other cases, the anchors 112 may be formed to include walls, or may be of other suitable configurations for a desired application.

In some examples, the upper structure 106 includes a layer of sealing material 114, and a spring structure 116, including one or more spring members 118. The upper structure further includes a plate 120, which is rectangular in this example, but which may have any suitable shape in other examples. The spring members 118 in this example may be referred to as beam springs, leaf springs, or other bar-shaped springs that may have an approximately square or otherwise rectangular cross section, although any other suitable cross section configurations may also be used, as discussed above. Further, the spring members need not be uniform along their lengths, but may taper or the like. In addition, the spring members 118 may for a single cell may differ from each other in shape, length, connection location, and so forth.

The spring structure 116 may further include spring junctions 122, which generally may overlie the anchors 112. The spring junction 122 may be the portion of at least one spring member 118 that overlies an anchor. In some cases, multiple spring members 118 may intersect at a spring junction 122. The spring structure 116 may further include connector elements 124 that connect the spring members 118 to the plate 120. In some examples, the spring junctions 122 and connector elements 124 may be made from the same contiguous piece of material as the spring members 118 and the plate 120. For instance, etching or other subtractive micromachining techniques may be used to generate the spring structure 116 and the plate 120. Alternatively, additive techniques, such as deposition, may be used, or a combination of additive and subtractive techniques. Additionally, in other examples, the plate 120, the spring members 118, the connector elements 124, and/or the spring junctions 122 may be made from separate materials that are connected to one another, such as using bonding techniques, or the like.

The spring structure 116 may be defined from the plate 120 by one or more openings 126, which are L-shaped in this example, such that four L-shaped openings 126 located between the spring members 118 and the plate 120 define the shape of the plate 120 and the cross-sectional width of the bar-shaped spring members 118. Accordingly, the stiffness of the spring members 118 may be controlled at least in part based on the size of the adjacent opening 126. For example, by moving or enlarging the openings 162 closer to an outer perimeter 128 of the spring structure 116, the stiffness of the spring members 118 may be decreased and an overall area of the plate 120 may be increased. As mentioned above, the plate 120 may be rigid relative to the spring members 118 so that the displacement profile of the plate is relatively uniform.

The anchors 112 may support the spring structure 116, and thereby the plate 120 at a known or selected distance from the substrate 108, such that a cavity 130 exists between the sealing member 114 (or the underside of the plate 120 when the sealing member is not present) and the insulation layer 110 (or the upper side of the substrate 108 when the insulation layer is not present). The sealing material 114 may seal the openings 126 between the spring structure 116 and the plate 120 within each cell 102, and may further seal any openings between neighboring cells, as discussed additionally below. In some cases, the sealing material 114 may also serve as an insulation layer so that insulation layer 110 may be optional.

In addition, as illustrated in FIG. 1, the transducer cell 102 may be included in a transducer array 132 that is made up of a plurality of the transducer cells 102. In some examples, the transducer cells 102 within the array 132 may be grouped into array elements 134, which include subsets of the cells 102 in the array 132. Accordingly, in some cases, one or more array elements 134 may make up the array 132. In the illustrated example, the array 132 includes three of the array elements 134, and each array element 134 includes 3×12 (i.e., 36) cells 102. Of course, implementations herein are not limited to any particular number of cells per array element or array elements per array. For instance, array elements 134 and the array 132 may be one-dimensional or two-dimensional. A one-dimensional arrangement of cells may include only a single row of cells 102, whereas, as illustrated in FIG. 1, a two-dimensional arrangement of cells may include cells 102 extending in two directions, e.g., both an x-axis direction and a y-axis direction.

In some cases, the cells 102 within each array element 134 may operate electrically at least partially independently of cells 102 in the other array elements 134. In this case, the cells 102 in the same array element 134 may be electrically connected, e.g., in parallel to each other to act as the equivalent of a single capacitor, such as for outputting an electrical signal in reception in response to receiving acoustic energy, and for generating acoustic energy in transmission in response to an inputted electric signal. However, the cells 102 in a first array element 134 may not be directly electrically connected to adjacent cells 102 in an adjacent array element 134.

Further, in some examples, the cells 102 in an array element 134 may be sealed (e.g., hermetically sealed) from an external environment. For instance, as discussed additionally below, in some examples, each array element 134 may be sealed independently of the other array elements 134, which may include a seal around a perimeter 136 of each array element 134. In addition, the plurality of cells 102 in a particular array element 134 may be sealed together, such that the array element 134 is sealed from the outside environment, but the cells 102 in the same array element 134 are not sealed from each other, and thus a cavity of each cell 102 may be connected to those of the other cells in the same array element 134. Additionally, or alternatively, in some examples, each cell 102 may be independently sealed from other cells 102 as well as from the exterior environment.

Figure 2:
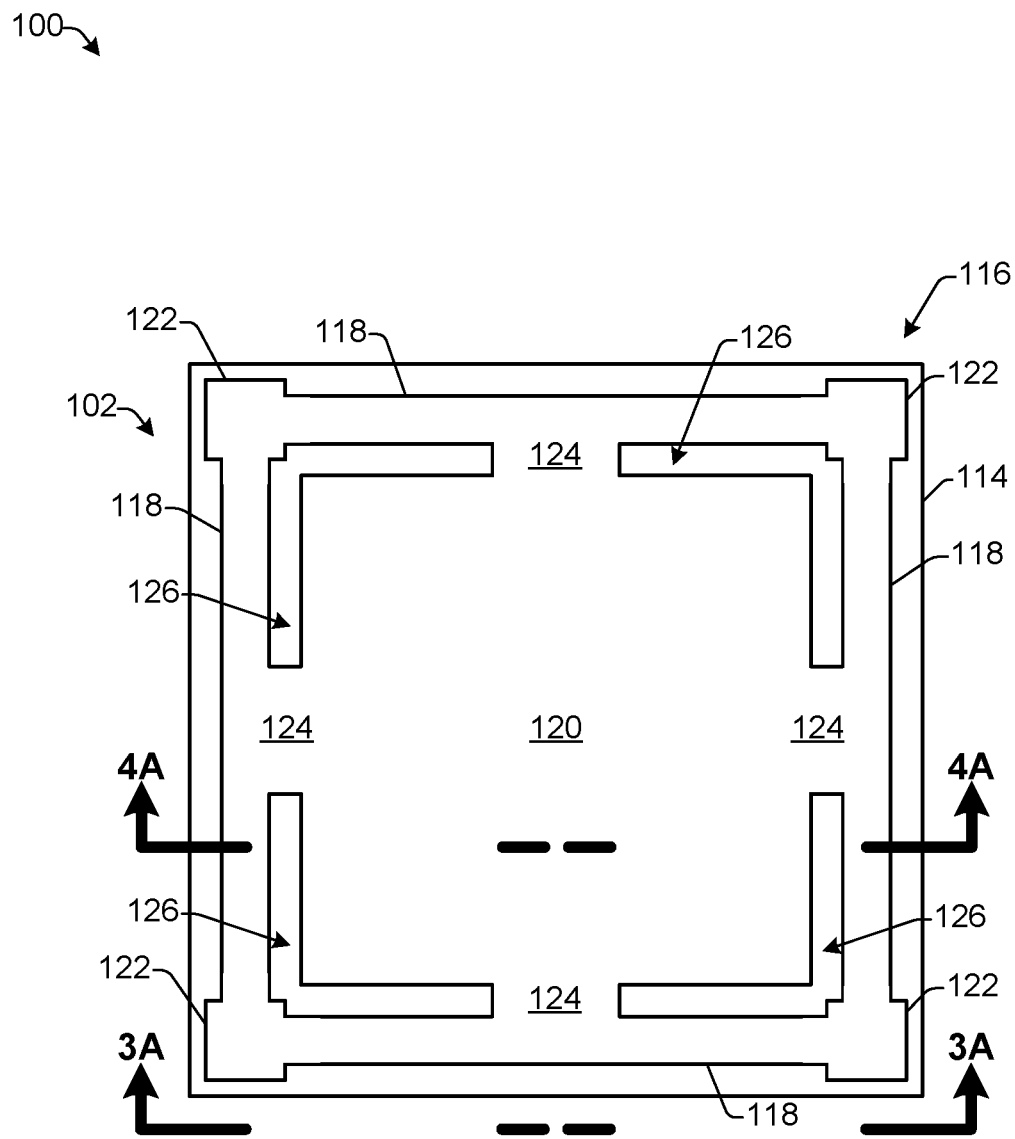
FIG. 2 illustrates a topside plan view of the example transducer cell of FIG. 1 according to some implementations.

FIG. 2 illustrates a plan view or topside view of the transducer apparatus of FIG. 1 according to some implementations. In this example, the cell 102 includes the spring structure 116 in a square, rectangular or other shape surrounding the plate 120. Further, as mentioned above, the size of the L-shaped openings 126 may be adjusted to control the stiffness of the spring members 118, the size of the connector elements 124, and the size of the plate 120.

Figure 3A:
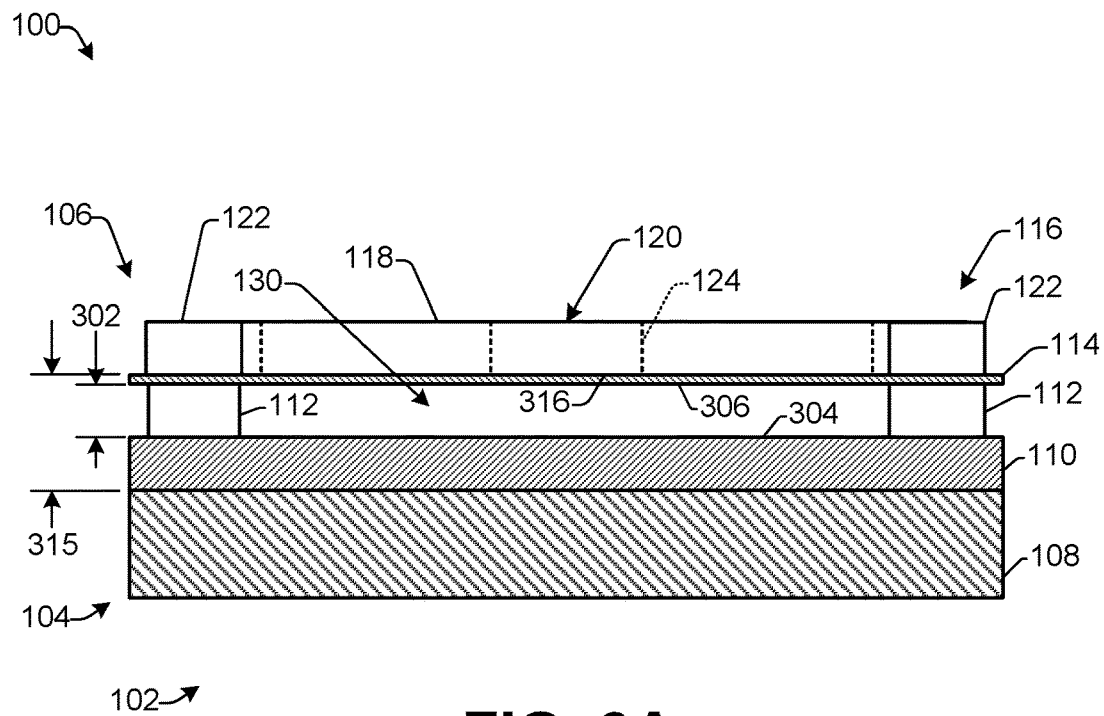
FIGS. 3A and 3B illustrate a side view of the example cell of FIG. 1, as taken along line 3A-3A of FIG. 2 according to some implementations.

FIG. 3A illustrates a side view of the transducer apparatus 100 as taken along line 3A-3A of FIG. 2. From this angle, it may be seen that the cavity 130 forms a transducing gap 302, which, in this example, is the distance between a top surface 304 of the insulation layer 110, and a bottom surface 306 of the sealing material 114. Further, it may be seen that the height of the anchors 112 may be controlled to control, at least in part, the size of the transducing gap 302. Additionally, in some cases, at least one of the insulation layer 110 or the sealing material 114 may be eliminated. Generally, the transducing gap 302 is the maximum distance that the plate 120 can move toward the substrate 108 before contact is made that stops further movement.

Figure 3B:
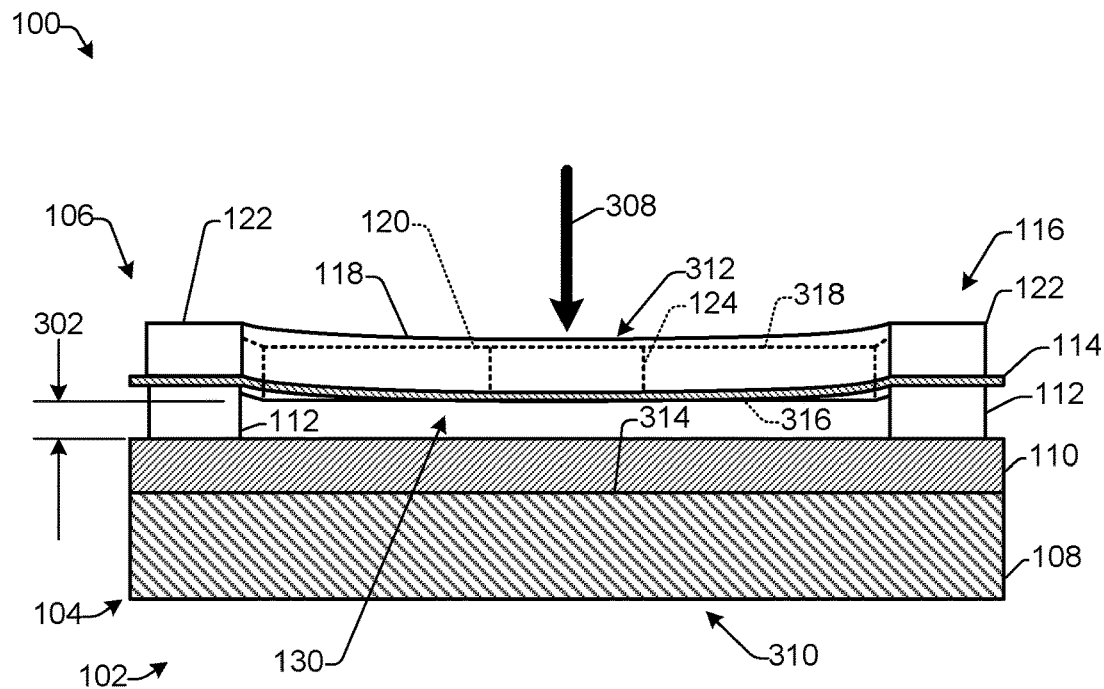

FIG. 3B illustrates the example transducer apparatus 100 of FIG. 3A in which the plate 120 has been moved toward the substrate 108, as indicated by arrow 308. Accordingly, the spring members 118 have flexed or bowed downward, while the plate 120, which is relatively more rigid than the spring members 118 has remained relatively unbent. Further, the transducing gap 302 has been reduced by the distance that the plate 120 has traveled toward the substrate 108. Consequently, this movement may cause a change in capacitance between a first electrode 310 associated with the substrate 108 and a second electrode 312 associated with the plate 120. For instance, as mentioned above, the first electrode 310 may be the substrate 108 itself, such as in the case that the substrate 108 is a conductive material or at least the portion under the plate 120 has been made conductive. As another example, a conductive layer of metal or other conductor may be deposited on a surface of the substrate, such as an upper surface 314. Similarly, the plate 120 may be of a conductive material, or at least a portion of the plate 120 over the cavity 130 may be rendered conductive, such as through doping. Thus, in this example, an electrode separation distance 315 is the distance between the respective nearest points of the first electrode 310 and the second electrode 312, i.e., the distance between the upper surface 314 of the substrate 108 and a lower surface 316 of the plate 120. As another example, a conductive layer of metal or other conductor may be deposited on a surface of the plate 120, such as the lower surface 316 or an upper surface 318 of the plate 120.

Figure 4A:
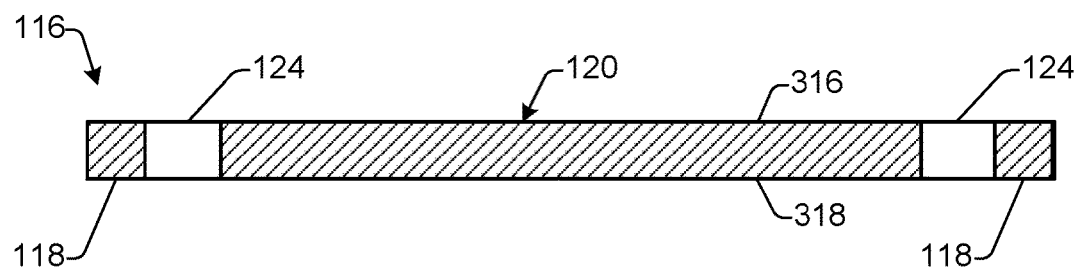
FIGS. 4A and 4B illustrate a cross-sectional view of a portion of the example cell of FIG. 1, as taken along line 4A-4A of FIG. 2 according to some implementations.

FIG. 4A illustrates a side cross-sectional view of the spring structure 116 and the plate 120 as taken along line 4A-4A of FIG. 2. In this example, the spring members 118 have a rectangular cross section (in this disclosure the term rectangular includes square unless specifically stated otherwise). However, other suitable cross sections may be used for the spring members 118, as enumerated above.

Figure 4B:
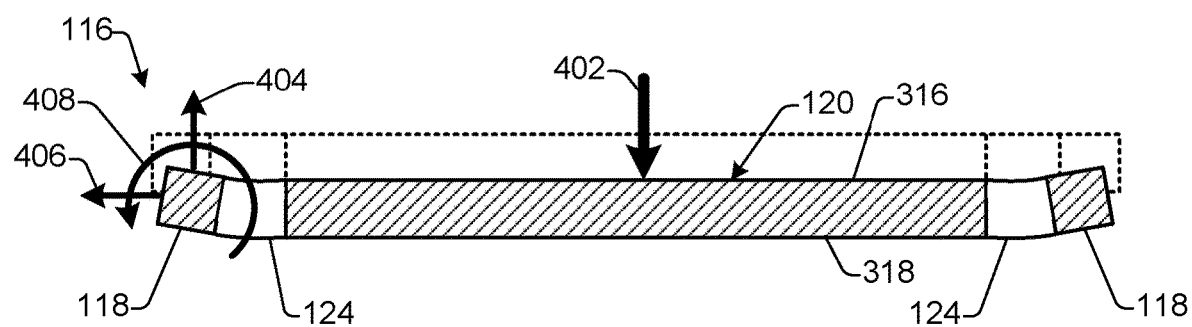

FIG. 4B illustrates the spring structure 116 and plate 120 of FIG. 4A in which the plate 120 has been moved toward the substrate 108 (not shown in FIG. 4B), as indicated by arrow 402. Accordingly, the spring members 118 have flexed, bowed, or otherwise bent downward and inward, while the plate 120, which is relatively more rigid than the spring members 118, has remained relatively unbent. For instance, a primary displacement of the plate 120 may be due to bending downward of the spring members 118 along the longitudinal axes of the spring members (i.e., downward in a z-axis direction of arrow 308, as discussed above with respect to FIG. 3B, and the direction of arrow 402 in FIG. 4B). Further, the spring members 118 may have also twisted slightly about a longitudinal axis. Accordingly, the spring members 118 may exert a biasing force to return the plate 120 to its original position. In this example, the biasing force has at least three components, i.e., a y-axis component 404, an x-axis component 406 and a torsional component 408.

Figure 5:
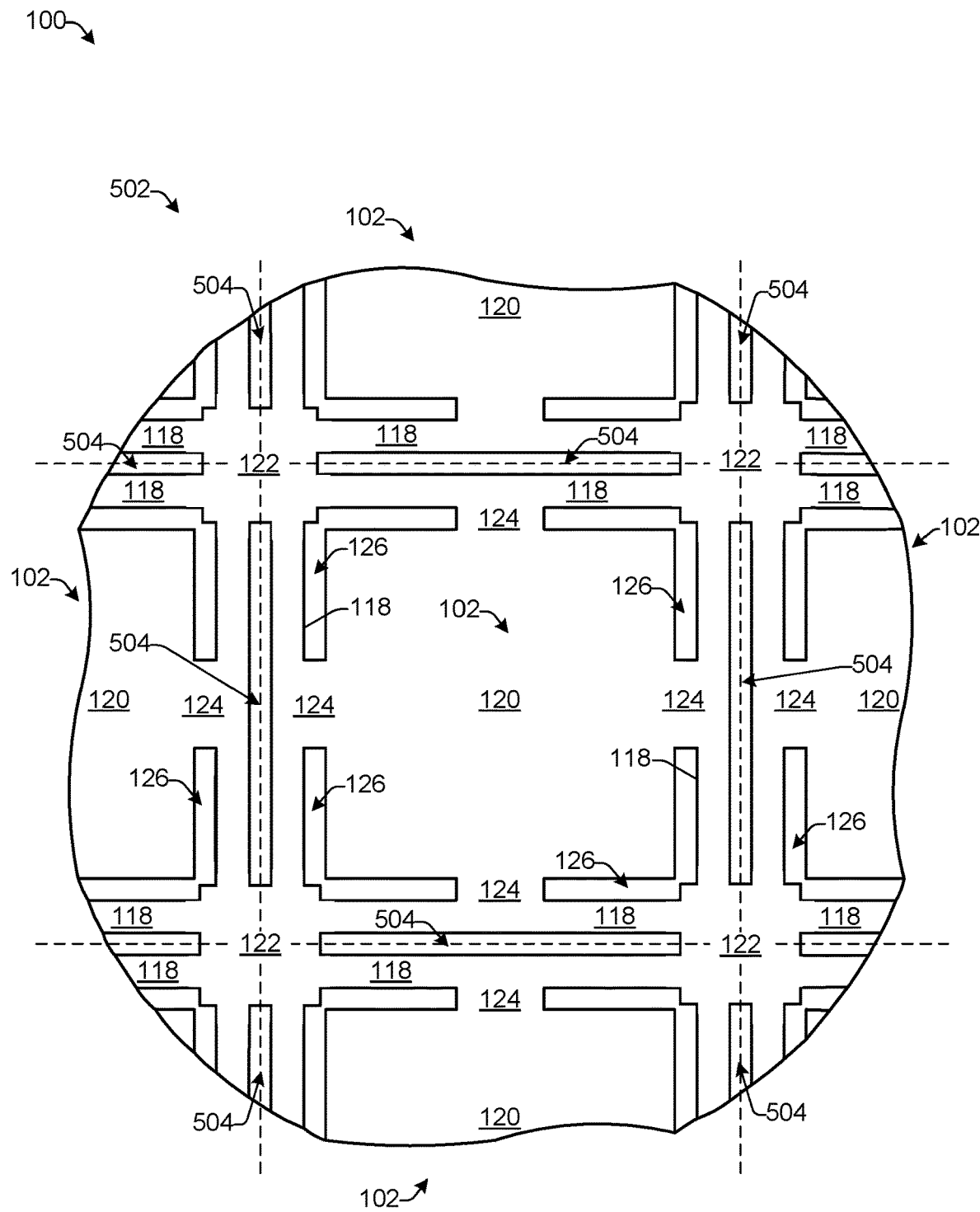
FIG. 5 illustrates an example transducer apparatus including a plurality of the example transducer cells arranged in at least a portion of an array according to some implementations.

FIG. 5 illustrates the example transducer apparatus 100 including a plurality of the example transducer cells 102 arranged in a side-by-side configuration, such as may be included in a transducer element or other portion of an array 502 according to some implementations. The vertical and horizontal dashed lines define the boundaries of individual cells 102. For instance, a plurality of the transducer cells 102 may be fabricated side-by-side, i.e., adjacent to one another to produce at least a portion of the array 502 of the transducer cells 102. Accordingly, a plurality of the plates 120 may be fabricated adjacent to one another from a single substrate, as discussed above, with the L shaped openings 126 defining each plate 120. Furthermore, adjacent springs 118 may be separated from each other by an elongate opening 504. In this example, the spring junctions 122 may form the junction of as many as eight separate spring members 118, from as many as four separate cells 102. As discussed above, each spring junction 122 may overlie an anchor extending from a substrate (not shown in FIG. 5). In some examples, the cells 102 may be individually addressable such that, in the case of transmission, an electric signal provided to each cell 102 may be individually controlled or, in the case of reception, a signal received from each cell 102 may be individually detected. In other examples, the individual cells 102 are not individually addressable, and instead electric signals may be sent to and received from multiple cells 102 in unison.

Figure 6:
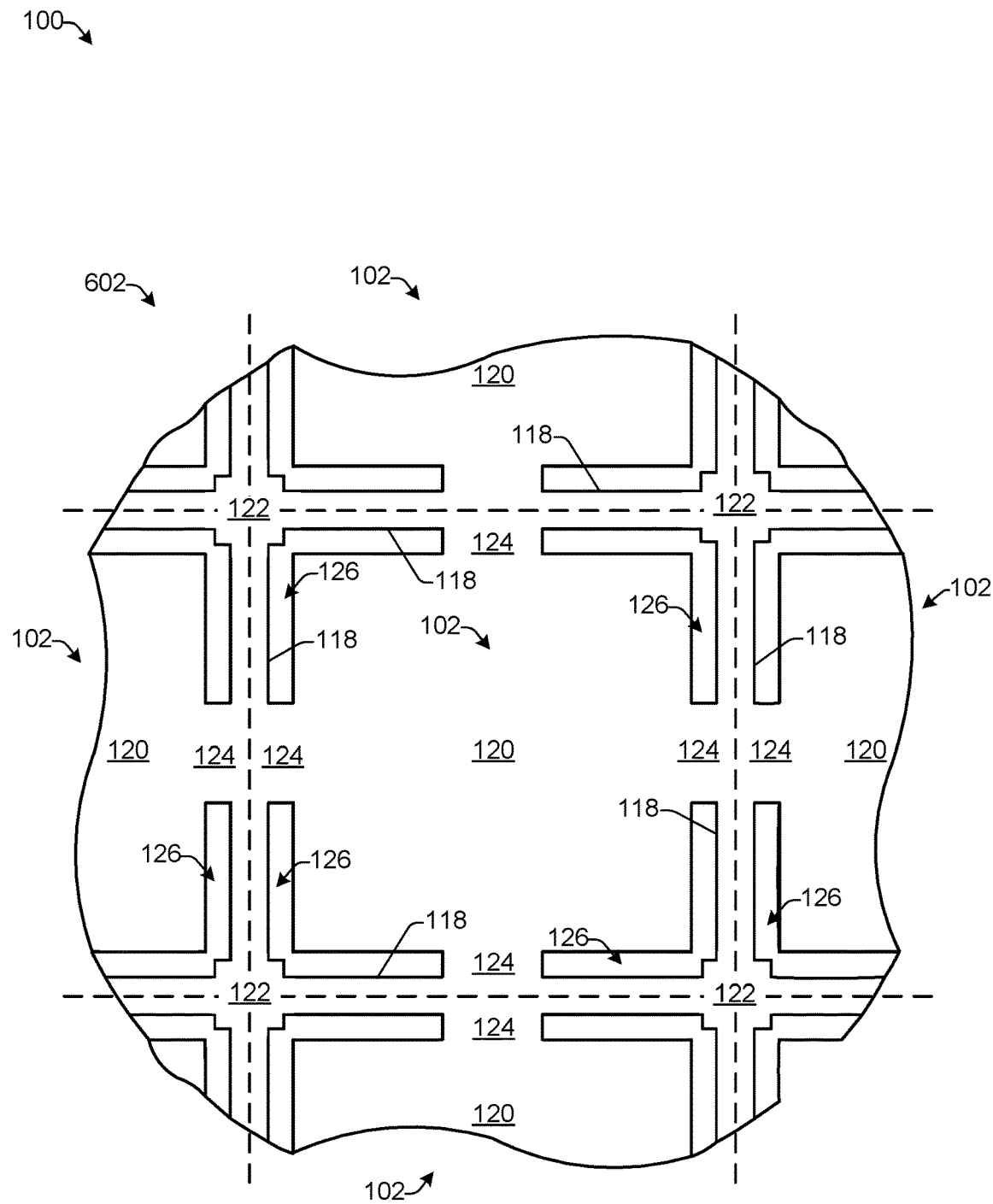
FIG. 6 illustrates an example transducer apparatus including a plurality of the example transducer cells arranged in at least a portion of an array according to some implementations.

FIG. 6 illustrates the example transducer apparatus 100 including a plurality of example transducer cells 102 arranged in an array 602 according to some implementations. In this example, rather than having the elongate openings 504 separating each cell 102, as discussed above with respect to FIG. 5, adjacent cells 102 may share spring members 118. For example, the plurality of plates 102 may be fabricated adjacent to one another with the L shaped openings 126 defining each plate 120. However, in this example, since neighboring cells share spring members 118, spring junctions 122 form the junction of only up to four springs 118, rather than eight as in the previous example of FIG. 5.

Figure 7:
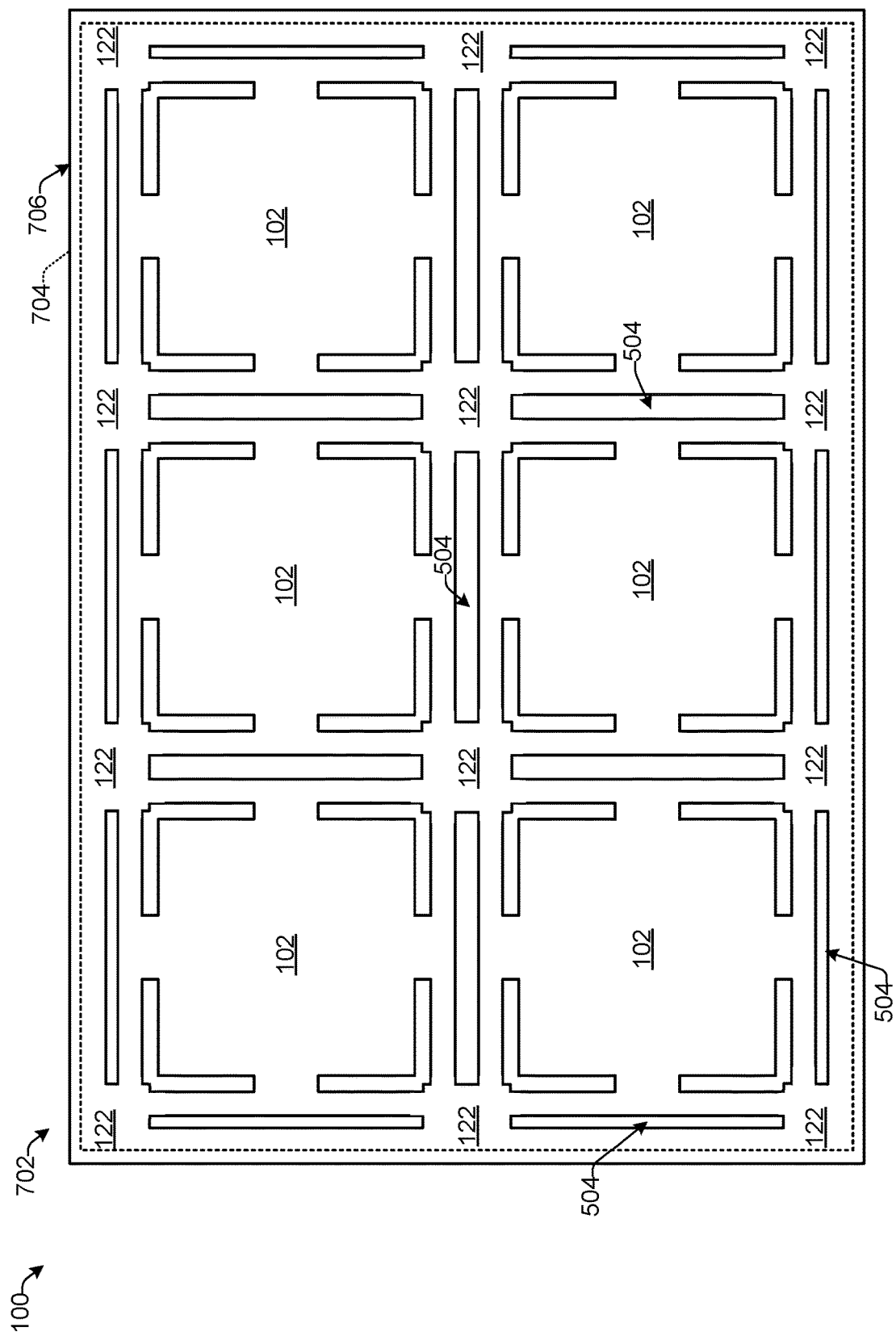
FIG. 7 illustrates an example transducer apparatus including a plurality of the example transducer cells arranged in at least a portion of an array according to some implementations.

FIG. 7 illustrates an example of the transducer apparatus 100 formed into an array element 702 of six individual cells 102 according to some implementations. For example, the array of FIG. 7 may correspond to the portion of the array of FIG. 5 discussed above. Alternatively, the portion of the array of FIG. 6 may be similarly configured as an array element 702. In either event, the array element 702 may include a perimeter seal 704 around a perimeter 706 of the array element 702. In both FIG. 5 and FIG. 6, the cavities of the cells 102 are in communication with each and are therefore interconnected and not sealed individually. Accordingly, multiple cells 102 can be sealed together as illustrated in the example of array element 702 of FIG. 7. For example, the perimeter seal 704 may be disposed around the outer perimeter of the array element 702. Consequently, the sealing material 114 may seal the upper side of the cavities, the substrate 108 (not shown in FIG. 7 may seal the underside of the cavities, and the perimeter seal 704 may seal the outer perimeter 706 of the array element 702. Following fabrication of the array element 702, a vacuum may be applied to the cavities and the sealing of the cavities may be completed to provide the transducer array element 702 with vacuum-sealed cavities.

Figure 8:
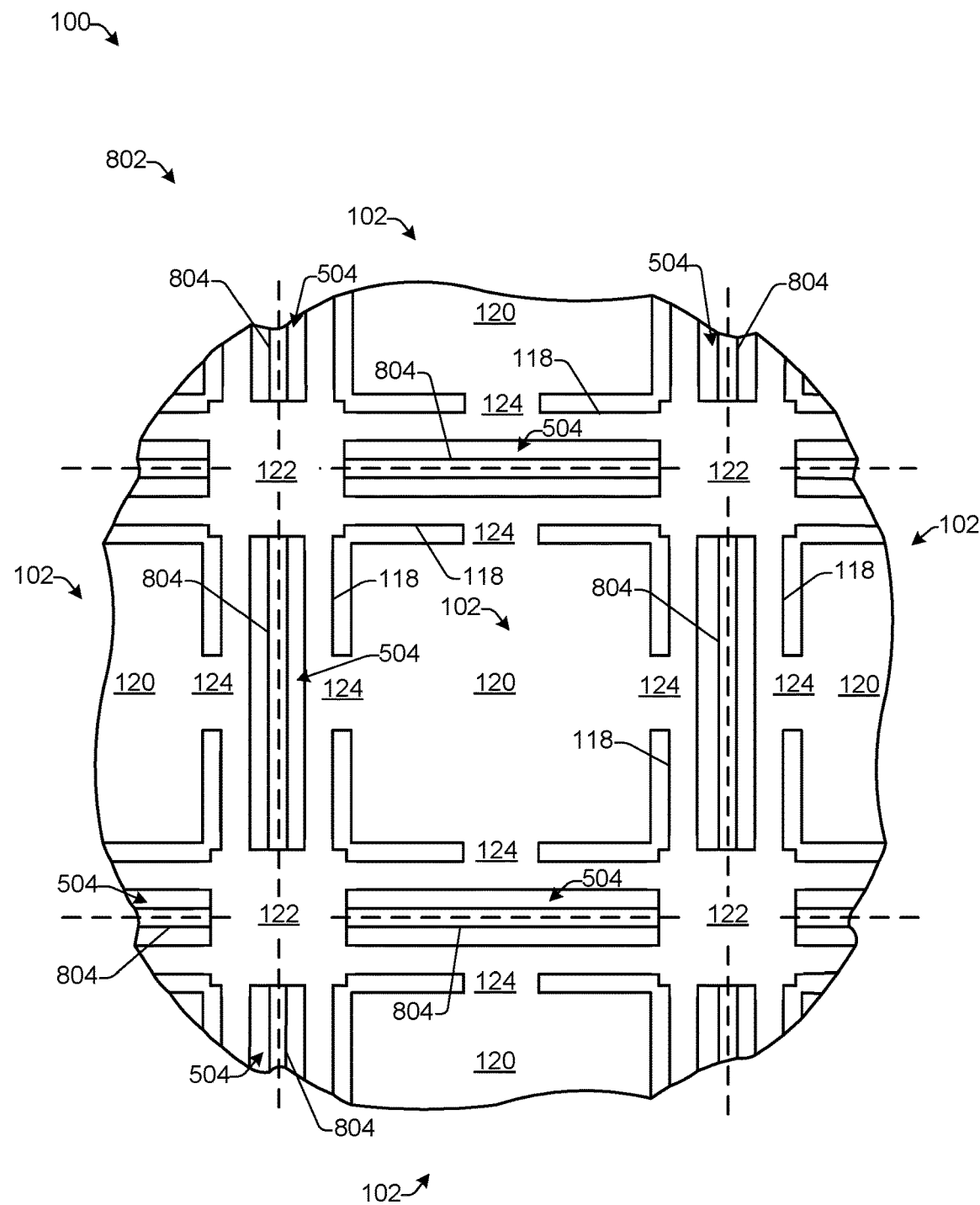
FIG. 8 illustrates an example transducer apparatus including a plurality of the example transducer cells arranged in at least a portion of an array according to some implementations.

FIG. 8 illustrates an example of the transducer apparatus 100 formed into at least a portion of an array 802 of multiple cells 102, which may be similar to the portion of the array 502 discussed above with respect to FIG. 5. In this example, each of the multiple cells 102 may have individually sealed cavities. Further, in FIG. 8, for clarity purposes, the elongate openings 504 are shown slightly larger and the sealing material 114 is not shown, to better illustrate a plurality of sealing walls 804 that may extend upward from the substrate in a manner similar to the anchors 112 in some examples. For instance, the sealing walls 804 may be contiguous with the anchors 112, and of the same height, so as to contact the sealing material 114 when the sealing material 114 is applied to the anchors 112. Accordingly, the sealing wall 804 and spring anchors 112 may define individual cavities 130 for each cell 102 to enable sealing of the individual cavities 130 of each cell 102.

Figure 9:
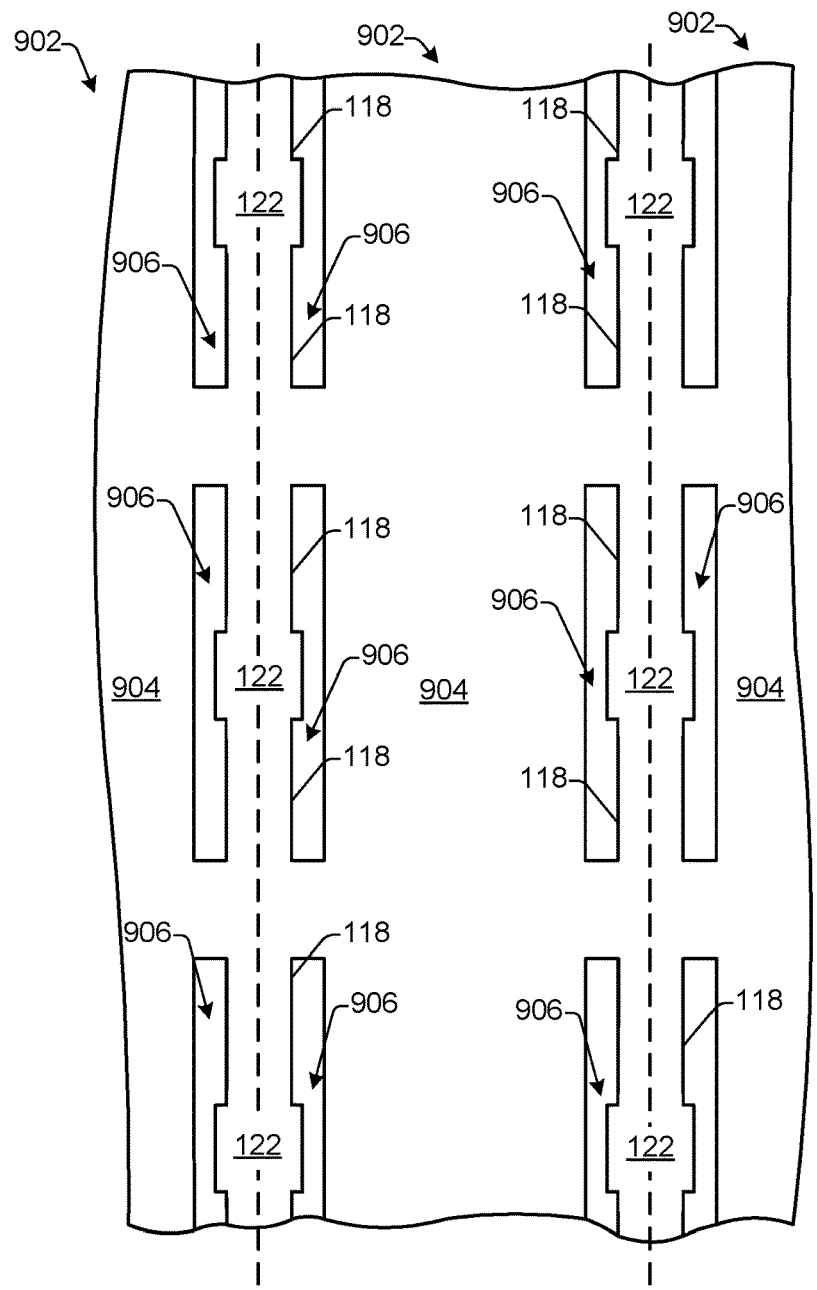
FIG. 9 illustrates an example transducer apparatus including a plurality of example transducer cells arranged in at least a portion of an array according to some implementations.

FIG. 9 illustrates an example transducer apparatus 900 according to some implementations that may operate similarly to the various implementations of the transducer apparatus 100 discussed above. For example, rather than having cells of a substantially square shape, as discussed above with respect to FIGS. 1-8, the cells can be fabricated to have various other suitable shapes, such as an elongate rectangle, a circle, a triangle, a ring, a hexagon, and so forth. In the example of FIG. 9, the transducer apparatus 900 includes a plurality of cells 902 in which each cell 902 includes an elongate rectangular plate 904 that extends past multiple spring junctions 122. Accordingly, a plurality of elongate openings 906 may be formed between adjacent plates 904 to define the plates 904 and to define the spring members 118, which are shared by adjacent cells 902. The transducer apparatus 900 of FIG. 9 may be operated in a manner similar to that discussed above with respect to the transducer apparatus 100.

Figure 10A:
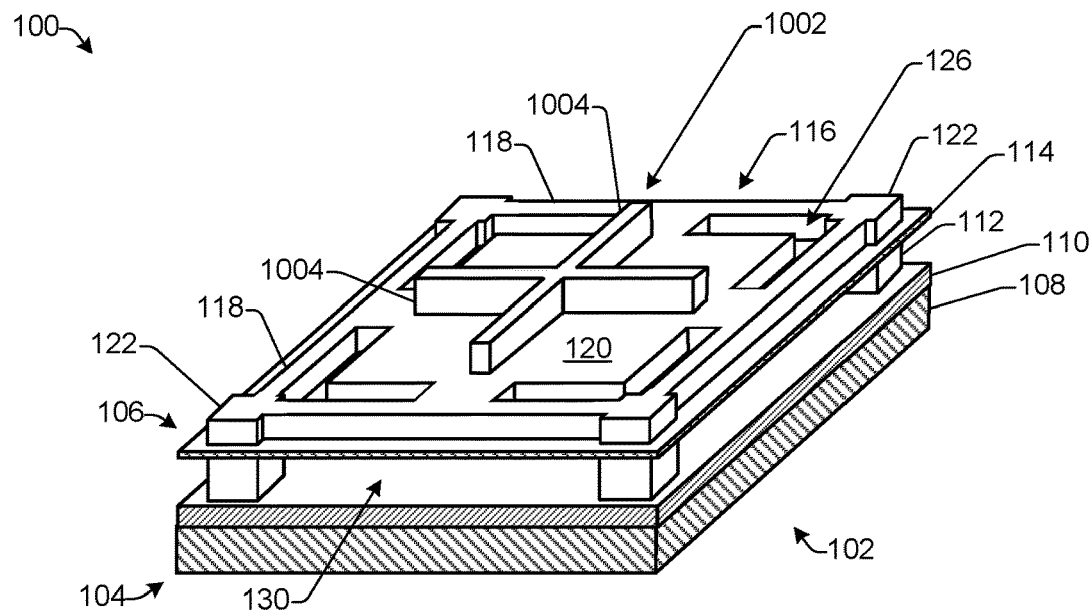
FIGS. 10A and 10B illustrate a perspective view and a plan view, respectively, of an example cell of a transducer apparatus including a plate enhancement element according to some implementations.
Figure 10B:
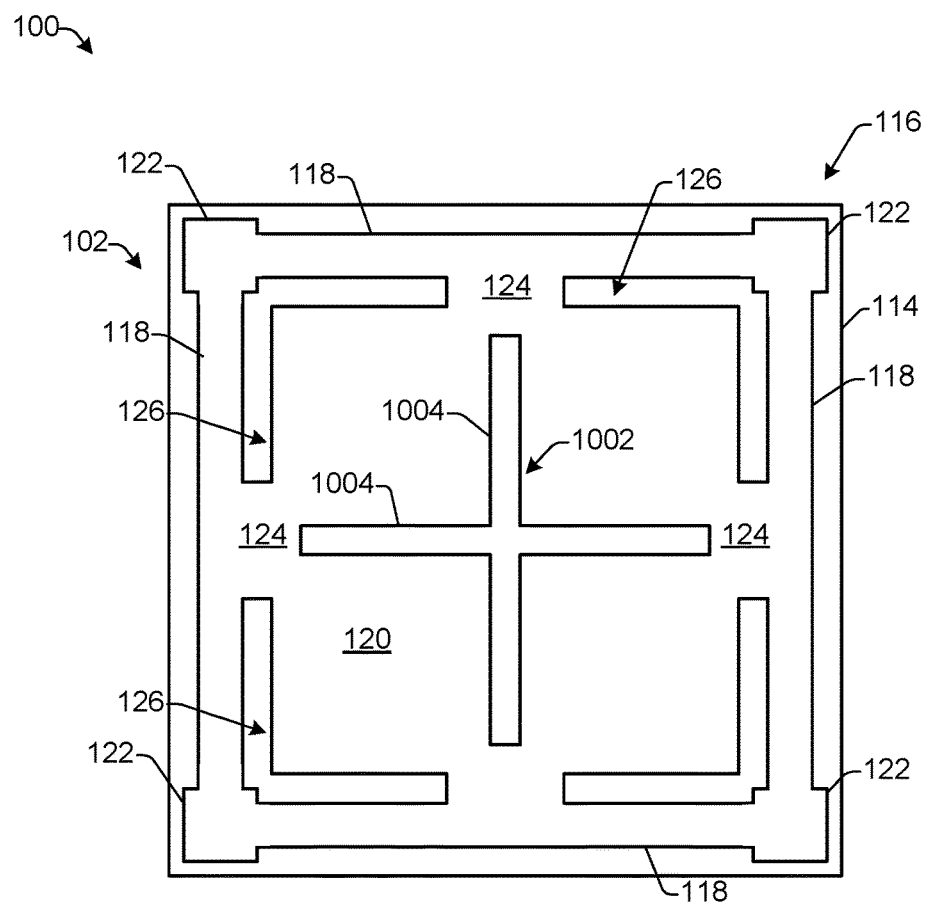

FIGS. 10A and 10B illustrate a perspective view and a plan view, respectively, of an example cell 102 of the transducer apparatus 100 including a plate enhancement structure according to some implementations. For instance, to improve the plate rigidity while reducing the mass of the plate 120, an enhancement structure 1002 can be disposed on the plate 120. The enhancement structure 1002 may include a plurality of beams, ridges, corrugations, struts, or other structures, that can act as stiffening elements, which can improve the displacement uniformity of the plate 120, and prevent bending of portions of the plate 120 relative to other portions. In the illustrated example of FIGS. 10A and 10B, the enhancement structure 1002 includes multiple cross beams 1004 that are formed on the upper surface of the plate 120. The enhancement structure 1002 may be included with the plate 120 so that the ratio of the resonant frequency of the plate 120 over the mass of the plate 120 is improved, as compared to a plate of similar mass without the enhancement structure 1002. In the illustrated example, the cross beams 1004 may be constructed from the same material as the plate 120, e.g., by etching, or from a different material that is deposited, bonded or otherwise attached to the upper surface of the plate 120.

Figure 11A:
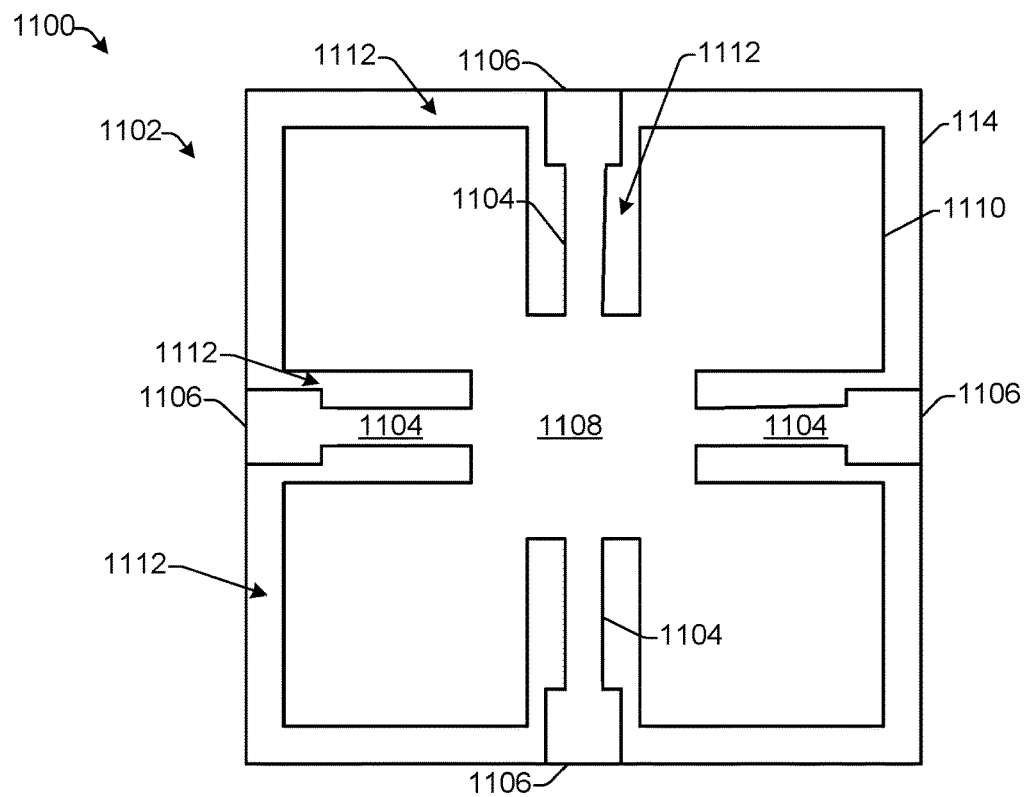
FIGS. 11A and 11B illustrate plan views of example cells of a transducer apparatus according to some implementations.
Figure 11B:
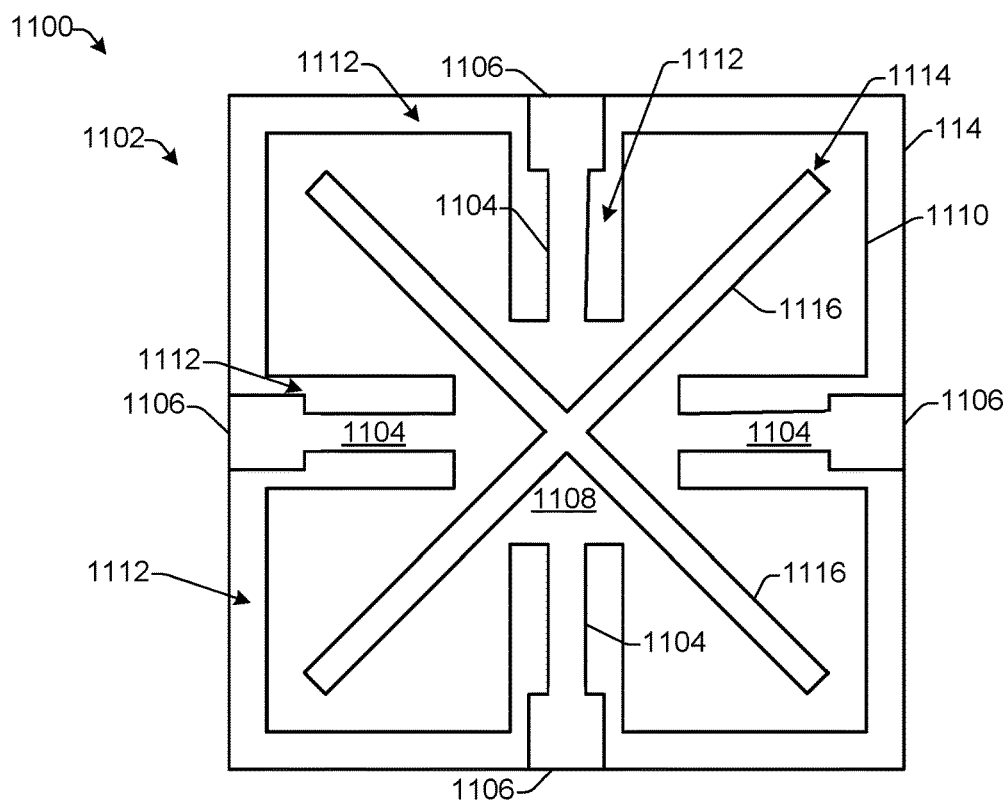

FIGS. 11A and 11B illustrate plan views of a transducer apparatus 1100 including an example cell 1102 according to some implementations. In this example, a plurality of spring members 1104 are cantilevered from respective spring junctions 1106 and are connected to a central portion 1108 of a plate 1110. Furthermore, a plurality of openings 1112 may be formed in the plate 1110 to define the spring members 1104 and to separate the plate 1110 of this cell 1102 from adjacent cells 1102 when the cells 1102 are formed into at least a portion of an array as discussed above. The spring junctions 1106 may be disposed over anchors (not shown in FIG. 11A) as discussed above, so that the plate 1110 is suspended over a cavity for resilient movement similar to the plate 120 in the examples discussed above. Consequently, the transducer apparatus 1100 may operate in a manner similar to the transducer apparatus 100 discussed above.

FIG. 11B illustrates a plan view of the transducer apparatus 1100 including an enhancement structure 1114 similar to the enhancement structure 1002 discussed above with respect to FIGS. 10A and 10B in this example, the enhancement structure 1114 includes a pair of crossed beams 1116. As mentioned above, the enhancement structure 1114 may increase the stiffness of the plate 1110 substantially without substantially increasing the mass of the plate 1110.

Figure 12:
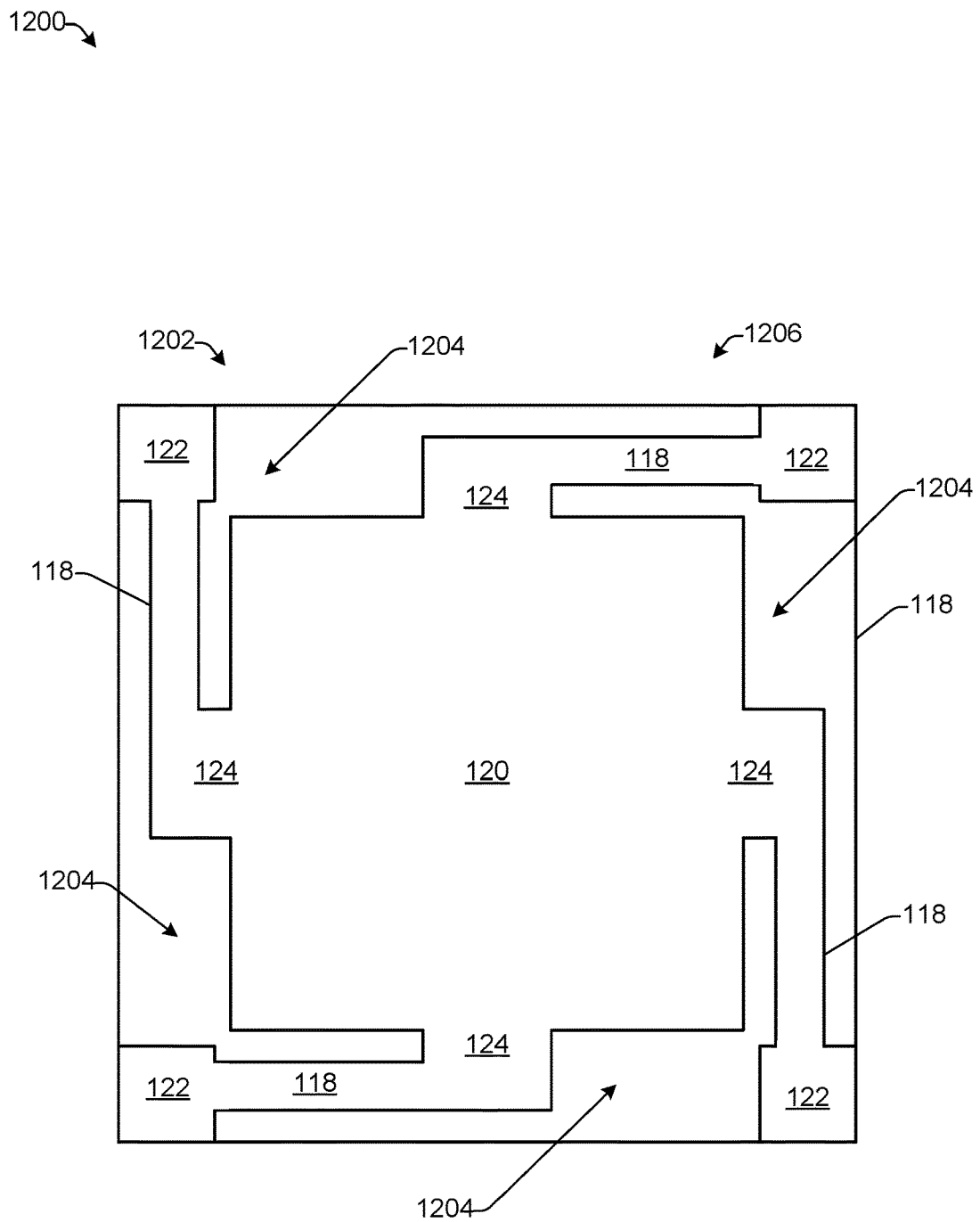
FIG. 12 illustrates a plan view of an example cell of a transducer apparatus according to some implementations.

FIG. 12 illustrates a plan view of a transducer apparatus 1200 including a cell 1202 according to some implementations. In the example of FIG. 12, one of the spring members 118 has been eliminated from each side of the plate 120. For example, four enlarged openings 1206 may be formed to define the plate 120 and the four spring members 118. Accordingly, a spring structure 1206 of this example includes one spring member 118 attached to each side of the plate 120, and cantilevered from its respective spring junction 122. The transducer apparatus 1200 may operate in a manner similar to the transducer apparatus 100 discussed above.

Figure 13A:
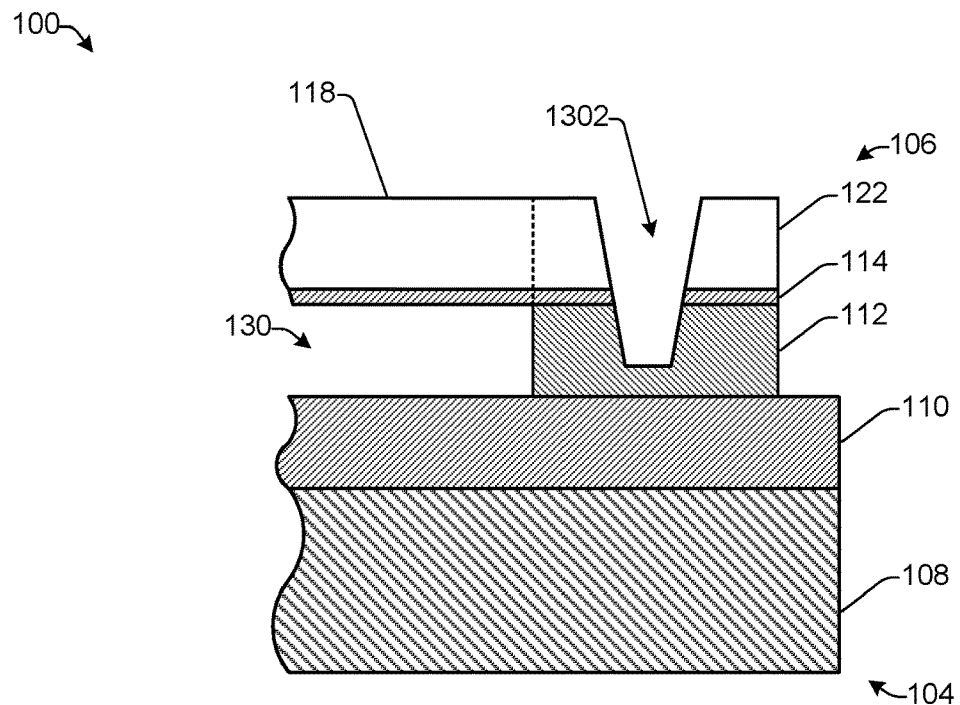
FIGS. 13A and 13B illustrate a cross-sectional view of an example anchor of a transducer apparatus according to some implementations.
Figure 13B:
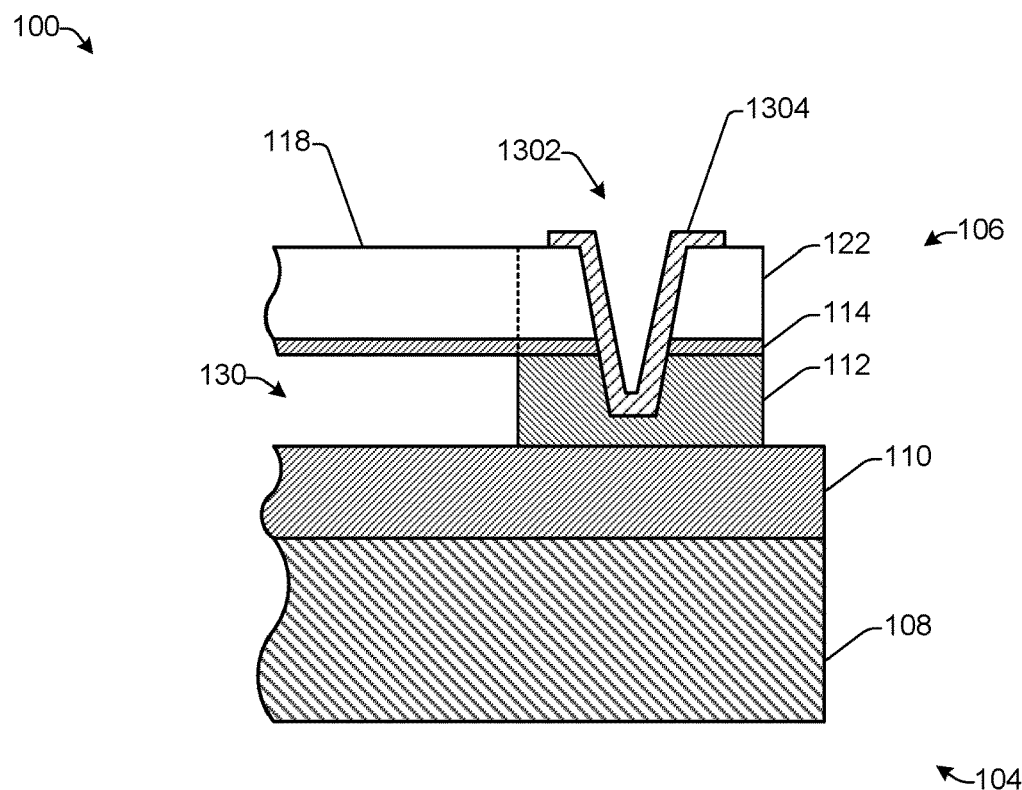

FIGS. 13A and 13B illustrate a cross-sectional view of an example anchor of a transducer apparatus according to some implementations. In this example, the upper structure 106 of the transducer apparatus 100 may be secured to the lower structure 104 of the transducer apparatus through the anchor 112. For instance, an opening 1302 may be formed through the spring junction 122, the sealing material 114 and into the anchor 112 as illustrated in FIG. 13A. The opening 1302 may be a generally conical opening, a cylindrical opening, a rectangular opening, or any other suitable shape.

As illustrated in FIG. 13B, a plug material 1304 may be deposited into the opening 1302 to secure the upper structure 106 relative to the lower structure 104 to further ensure the reliability of the anchor 112. The plug material 1304 may strengthen the adhesion between the upper structure 106 and the anchor 112. In some examples, the plug material 1304 may be a dielectric material or nonconductive material. The plug material 1304 may be deposited, sputter-coated, spin-coated, thermally grown, etc., over the opening 1302, and may be patterned to a desired shape.

FIGS. 14A-14F illustrate a side cross-sectional view of an example of the transducer apparatus 100 during select example fabrication operations according to some implementations. The other transducer apparatuses discussed herein may be fabricated similarly.

As illustrated in FIG. 14A, a first fabrication substrate 108 may be provided. In some examples, recess patterns optionally may be formed on the upper surface 314 of the substrate 108. For example, one or more first recess pattern 1402 may be formed for receiving one or more respective anchors. In some examples, the recess pattern 1402 may be formed to enable the anchors to include insulation extensions. For instance, in the case that the substrate 108 is conductive and is able to serve at least in part as the first electrode, an insulation extension may reduce parasitic capacitance by extending a non-conductive anchor and/or associated insulation material into the substrate 108, such as below an area where the transducing gap will be.

Furthermore, one or more second recess patterns 1404 may be formed in the expected location of respective transducing cells, such as where the bottom of the cavity will be located. This can give the bottom electrode a non-flat electrode surface in some examples. The non-flat surface may be designed to increase the transducer efficiency by increasing average electrical field intensity with given applied voltage. In addition, a third recess pattern 1406 may be formed around a perimeter of the substrate 108, such as to enable formation of a seal around the perimeter of the substrate 108, e.g., for sealing a plurality of transducer cells, such as for sealing an array element, as discussed above with respect to FIG. 7. In addition, in other examples, the recess patterns 1402, the recess patterns 1404 and/or the recess pattern 1406 are not formed. Thus, in some cases, some or all of the recess patterns 1402, 1404 and 1406 may be optional and/or other types of recess patterns may be formed.

The substrate 108 can be any suitable fabrication substrate, such as a silicon wafer, a glass wafer, a quartz wafer or any other substrate suitable for MEMS (microelectromechanical system) fabrication. As mentioned above, in some examples the substrate 108 may be conductive or may be made conductive, such as through doping of portions of the substrate 108, so that the substrate may serve as a common first electrode, or portions of the substrate may serve as the first electrode(s). In other examples, one or more layers of conductive material may be patterned onto the substrate, such as at the locations of the recesses 1404.

In FIG. 14B, a first layer 1408 is grown, deposited, bonded to, joined to, or otherwise disposed on the substrate 108, and patterned to a desired shape to form the anchors 112 that may be used to support the spring structure as discussed above. In some examples, the anchors 112 may be shaped as posts, or the like, extending outward a specified distance from the upper surface 314 of the substrate 108. The first layer 1408 may further be patterned to form a wall 1410, which may serve as a seal around the perimeter of a plurality of transducer cells. The material used to form the first layer 1408 may be oxide, nitride, or other suitable dielectric or other non-conductive material. Additionally, in some examples, the anchors 112 may include walls (not shown in FIG. 14B) formed to define individual cavities corresponding to individual transducer cells, as discussed above, e.g., with respect to FIG. 8. The walls may seal individually the transducer cells from adjacent cells.

In FIG. 14C, an additional layer of insulating material may be grown, deposited, bonded to, joined to, or otherwise disposed on the substrate 108 to be the insulation layer 110. The material used to form the insulation layer 110 may be oxide, nitride, or other suitable dielectric or other non-conductive material, and may be the same material as the first layer 1408, or a different material.

In FIG. 14D, a second substrate 1412 is joined to or otherwise placed in contact with the anchors 112 and the wall 1410 previously formed on the first substrate 108. The second substrate 1412 may include the sealing material 114, a device layer 1414, an intermediate insulation layer 1416, and a handling layer 1418. For example, the second substrate 1412 may be a silicon-on-insulator (SOI) wafer that initially includes the device layer 1414, the intermediate insulation layer 1416, and the handling layer 1418. The sealing material 114 may be grown, deposited, or otherwise disposed on the surface of the device layer 1414 prior to placement of the second substrate 1412 on the first substrate 108. The sealing material 114 may be oxide, nitride, polyimide, parylene, or any other suitable flexible material. Following disposing of the sealing material 114 on the device layer 1414, the second substrate 1412 is flipped and bonded with the substrate 108, which forms cavities 130 between the first substrate 108 and the second substrate 1412. Any suitable bonding techniques may be used for bonding the sealing material 114 to the upper surfaces of the anchors 112 and/or the sealing wall 1410. As described below, at least a portion of the plate 120 and/or the spring structure 116 can be fabricated from the device layer 1414. Further, in some examples, the sealing material 114 is not included, or the sealing material may be deposited at a later stage and/or in a different location, such as overlying the plate and spring structure. Additionally, in some examples, the anchors 112 may be formed or otherwise disposed on the second substrate 1412 before disposing the second substrate onto the first substrate 108.

Figure 14E:
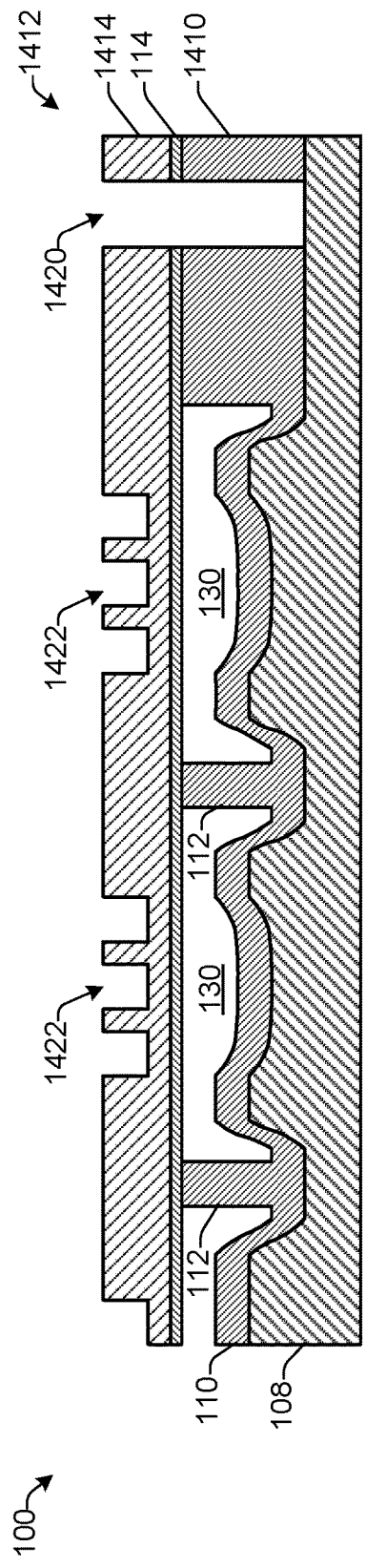

In FIG. 14E, the handling layer 1418 and the intermediate insulation layer 1416 are removed, leaving the device layer 1414 exposed. In some examples, an opening 1420 is formed through the device layer 1414, the sealing material 114, and the sealing wall 1410, to enable electrical access to the first substrate 108 near the perimeter. Additionally, a desired pattern 1422 can be formed on the device layer 1414 to control the mechanical properties of the portions of the device layer 1414 that will become the plate(s) 120. For example, as discussed above, the upper surface of the plate may be machined to include one or more enhancement structures, such as stiffening elements (e.g., beams, struts, corrugations, etc.) as discussed above with respect to FIGS.

10A, 10B and 11B. For example, the pattern 1422 can also be formed in the spring member area to make the spring membrane thinner, and thereby more flexible.

Figure 14F:
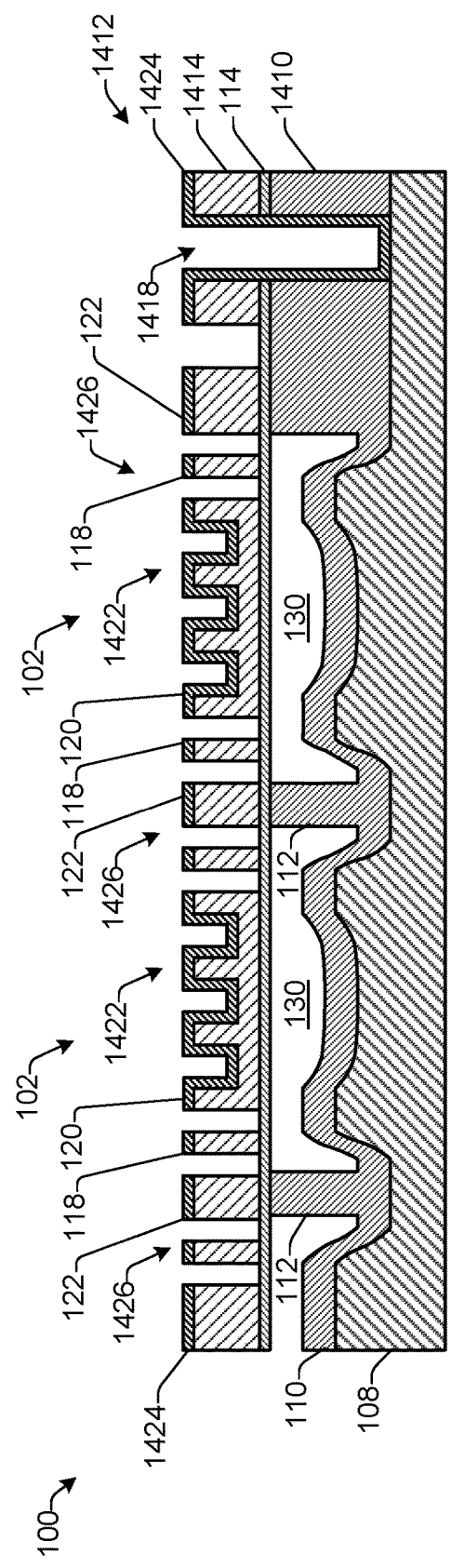

In FIG. 14F, in some examples, a conductive layer 1424 of metal or other conductive material may be deposited and patterned onto the device layer 1414 to serve as the top or second electrode. Alternatively, in some examples, the device layer 1414 may be conductive, or select portions of the device layer 1414 may be made conductive to serve as the second electrode. Additionally, the device layer 1414 and the metal layer 1424 may be etched or otherwise micromachined to form trenches or other openings 1426 for forming the plate 120, the spring members 118, and the spring junctions 122. For example, the device layer 1414 may be etched down to the sealing material 114. If the device layer 1414 is conductive, the device layer 1414 can also be etched to form electrical isolation between particular cells 102 of the transducer apparatus 100, such as between cells that are grouped into different array elements. Thus, individual array elements of a CMUT array may be independently electrically addressable by having independently addressable second electrode portions with a common first electrode portion. For instance, as mentioned above, the first substrate 108 can be the first electrode portion if made of a conductive material, such as silicon. Alternatively, a conductive layer may be formed on the first substrate 108 as the first electrode portion if the substrate 108 is not sufficiently conductive.

FIGS. 15A-15F illustrate a side cross-sectional view of an example of the transducer apparatus 100 during select fabrication operations according to some implementations. The fabrication techniques of FIGS. 15A-15F may include the fabrication of individually sealed cells, whereas in the fabrication techniques of FIGS. 14A-14F, the cells might not be individually sealed from each other. The other transducer apparatuses discussed herein may be fabricated similarly.

Figure 15A:
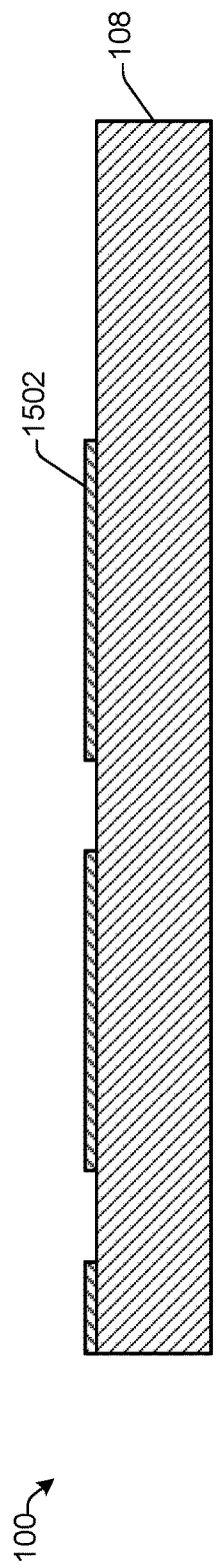

In FIG. 15A, a first fabrication substrate 108 of the transducer apparatus 100 may be a silicon wafer, a SOI wafer, a quartz wafer, a glass wafer, or any other material suitable for MEMS processing, as discussed above. If a non-conductive substrate is used, then a conductive material 1502 may be patterned or otherwise disposed on the substrate as the first electrodes. For instance, a layer of the conductive material 1502 may be deposited at particular locations on the substrate 108 corresponding to where the cells 102 will be formed.

Figure 15B:
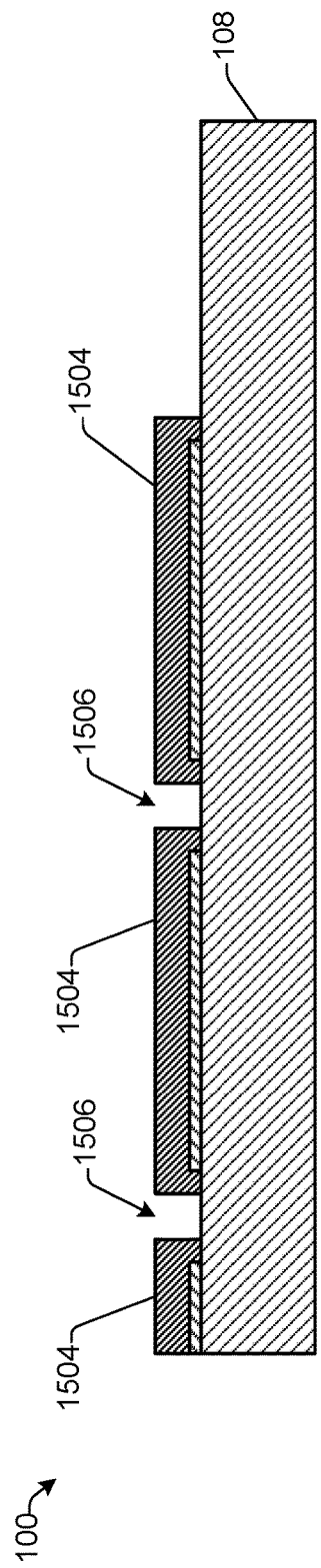

In FIG. 15B, a layer of sacrificial material 1504 may be formed, deposited, or otherwise disposed on the first substrate 108 and patterned according to discrete locations of the conductive material 1502 and/or the locations at which the cells 102 will be located. Openings 1506 may be left between the portions of the sacrificial material 1504 for formation of the anchors, as discussed below. Examples of suitable sacrificial materials include oxide, polysilicon, metal, polymer, photoresist, and so forth.

Figure 15C:
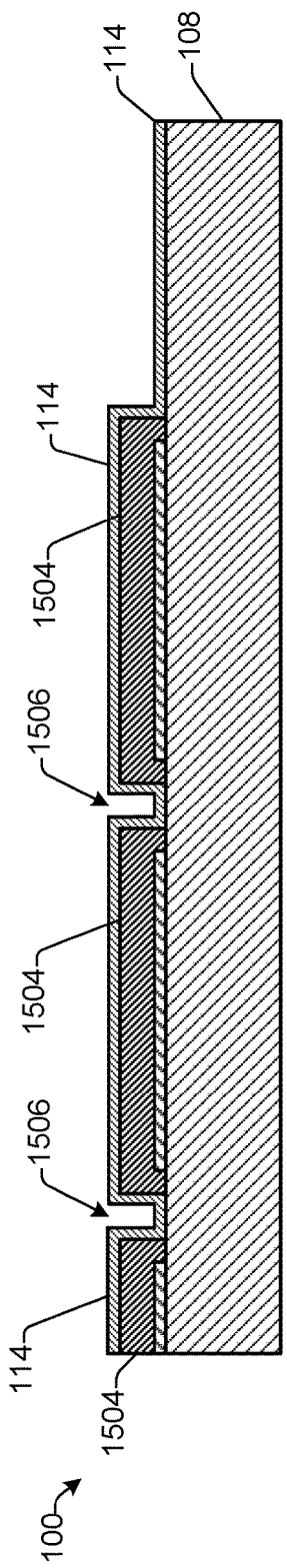

In FIG. 15C, a layer of the sealing material 114 may be formed, deposited, or otherwise disposed over the sacrificial material 1504. For example, the sealing material 114 may be patterned to be a desired shape, may overlie the portions of sacrificial material 1504, and may at least partially fill the openings 1506 between the portions of the sacrificial material 1504 at the intended cell locations. As mentioned above, examples of suitable sealing material 114 may include oxide, nitride, metal, parylene, polyimide, and other polymers.

In FIG. 15D, a layer of silicon or other suitable plate material 1508 is formed on the sealing material 114. The plate material 1508 may be used to form at least part of the plate and spring structure. An opening 1510 may be formed in the plate material 1508 to enable access to the first electrode(s) corresponding to the conducted material 1502. In addition, an opening (not shown) may be formed to access the sacrificial material 1504.

In FIG. 15E, the sacrificial material 1504 may be removed to form the cavities 130. The cavities 130 may be sealed in vacuum so that a vacuum exists in the cavities 130.

In FIG. 15F, in some examples, a conductive layer 1512 of metal or other conductive material may be deposited and patterned onto the plate material 1508 to serve as the top or second electrode. Alternatively, in some examples, the plate material 1508 may be conductive, or select portions of the plate material 1508 may be made conductive to serve as the second electrode. Additionally, the plate material 1508 and the conductive layer 1512 may be etched or otherwise micromachined to form trenches or other openings 1514 for forming the plate 120, the spring members 118 and spring junctions 122. For example, the plate material 1508 may be etched down to the sealing material 114. Further, in this example, the anchors 112 are formed from the plate material. If the plate material 1508 is conductive, the plate material 1508 can also be etched to form electrical isolation between particular cells 102 of the transducer apparatus 100, such as between cells that are included in separate array elements. Thus, individual array elements of a CMUT array may be independently electrically addressable by having independently addressable second electrodes with a common bottom electrode or with individually addressable bottom electrodes. Optionally, the sealing material 114 can also be deposed after the plates and springs are formed.

Figure 16:
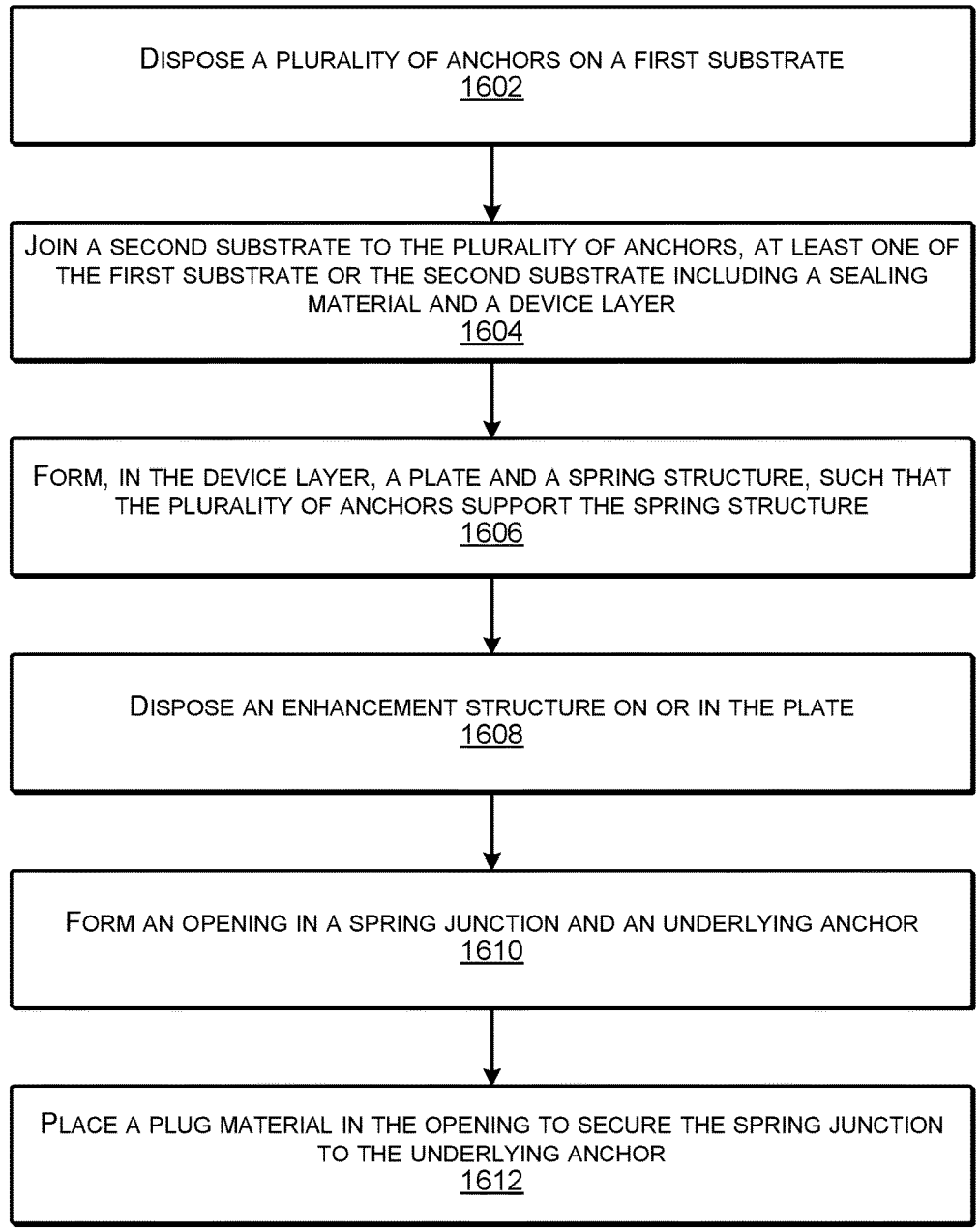
FIG. 16 is a flow diagram of an example process for fabricating a transducer apparatus according to some implementations.

FIG. 16 illustrates an example process for fabricating a transducer apparatus according to some implementations. This process is illustrated as a collection of blocks in a logical flow diagram, which represents a sequence of operations. The order in which the operations are described should not be construed as a limitation. Any number of the described blocks can be combined in any order and/or in parallel to implement the process, or alternative processes, and not all of the blocks need be executed, as some of the operations may be optional.

At 1602, the process may include disposing a plurality of anchors on a first substrate. For example, disposing the plurality of anchors on the first substrate may be by any suitable technique. Accordingly, the anchors may be grown, deposited, etched, formed, bonded to, joined to, or otherwise disposed on the first substrate.

At 1604, the process may include joining a second substrate on the plurality of anchors. Furthermore, one of the first substrate or the second substrate may include a sealing material already deposited thereon and a device layer. Alternatively, in other examples, the sealing material may be applied during a subsequent operation.

At 1606, the process may include forming, in the device layer, a plate and a spring structure such that the plurality of anchors support the spring structure and the spring structure supports the plate. In some examples, the spring structure may include a plurality of bar-shaped spring members, which may be cantilevered from a single anchor, or which may be supported between multiple anchors. Further, in some cases, a plurality of the plates may be formed side-by-side to form a first plurality of transducer cells as a first array element and a second plurality of transducer cells as a second array element. Thus, multiple array elements may be formed to create, at least in part, a transducer array. Furthermore, a first perimeter of the first array element may be sealed, and a second perimeter of the second array element may be separately sealed so that the first array element is sealed separately from the second array element. For instance, the cavities of the transducer cells in the first array element may be connected to each other, but sealed from the environment external to the first array element. Similarly, the cavities of the transducer cells in the second array element may be connected to each other, but sealed from the environment external to the second array element. Further, in other examples, each cavity of each cell may be individually sealed.

At 1608, the process may optionally include forming or otherwise disposing an enhancement structure on or in the plate. For example, the enhancement structure may be one or more stiffening elements such as cross beams, corrugations, structure the like that may add stiffness to the plate. The enhancement structure may be disposed on the plate before or after the processing steps of block 1606 discussed above, and the disposing may include any suitable technique, including growing, depositing, etching, forming, bonding, joining, or the like.

At 1610, the process may optionally include forming an opening in at least one spring junction and an underlying anchor. For example, a conical, cylindrical or other shape opening may be formed through the spring junction into the anchor.

At 1612, the process may optionally include placing a plug material into the opening to secure the spring junction to the underlying anchor. For example, the plug material may be any suitable material, such as an oxide, and may securely bond the spring junction to the underlying anchor.

Figure 17:
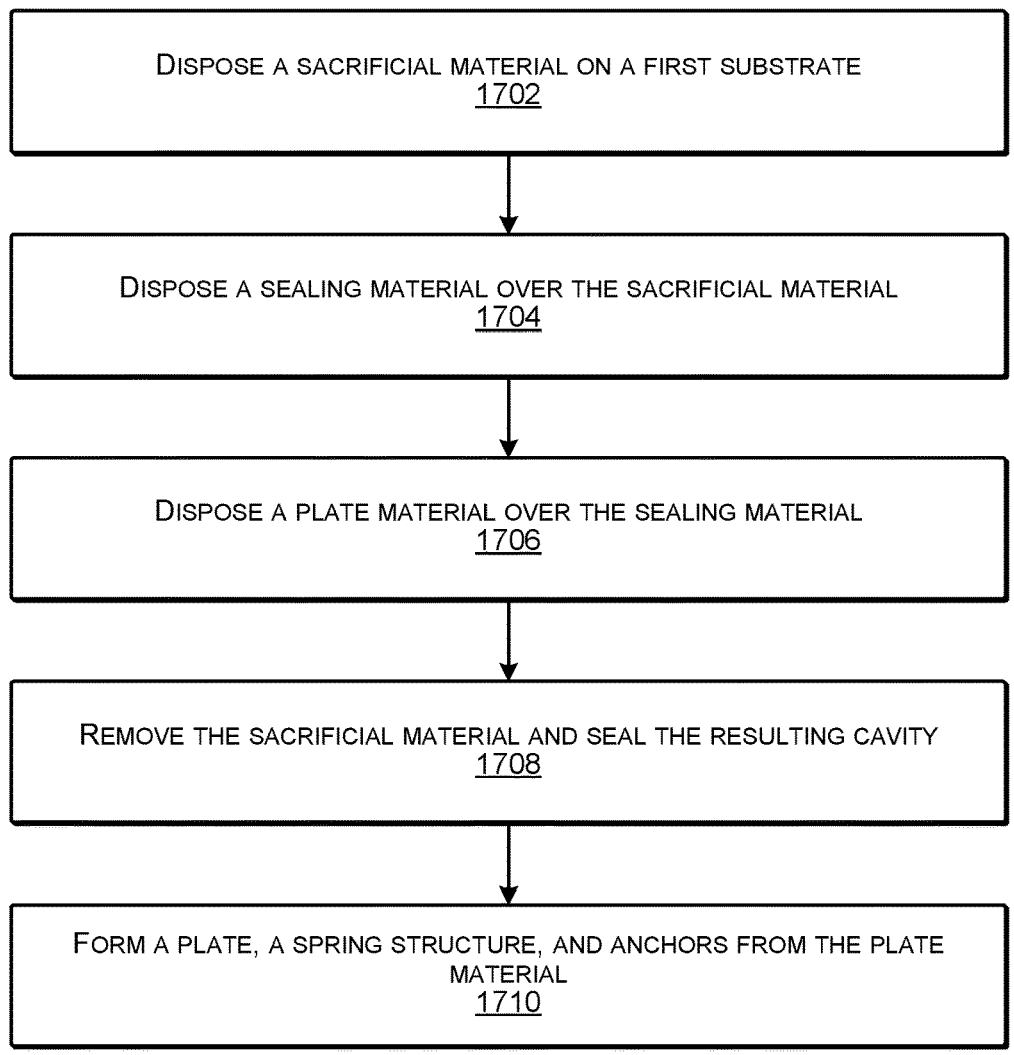
FIG. 17 is a flow diagram of an example process for fabricating a transducer apparatus according to some implementations.

FIG. 17 illustrates an example process 1700 for fabricating a transducer apparatus according to some implementations. This process is illustrated as a collection of blocks in a logical flow diagram, which represents a sequence of operations. The order in which the operations are described should not be construed as a limitation. Any number of the described blocks can be combined in any order and/or in parallel to implement the process, or alternative processes, and not all of the blocks need be executed, as some of the operations may be optional. In some cases, the process 1700 may be used to form transducer cells that are individually sealed.

At 1702, the process may include disposing a sacrificial material on a first substrate. For example, the sacrificial material may be disposed on the substrate at locations at which the transducer cells will be formed.

At 1704, the process may include disposing a sealing material over the sacrificial material. For example, the sealing material may be a layer of flexible material that overlies the sacrificial material and spaces in between the sacrificial material.

At 1706, the process may include disposing a plate material over the sealing material. In some examples, the plate material may be deposited or otherwise formed over the flexible material.

At 1708, the process may include removing the sacrificial material and sealing the resulting cavity left by the removal of the sacrificial material. For example, the cavity may be sealed in a vacuum, which results in a vacuum in the cavity. Accordingly, a plurality of sealed cavities may be made which may correspond to a plurality of transducer cells.

At 1710, the process may include forming a plate, a spring structure, and anchors from the plate material. For example, etching or other micro-machining techniques may be used to form the plate, a spring structure supporting the plate and anchors supporting the spring structure.

Additionally, the processes described herein are only several examples of possible processes provided for discussion purposes. Numerous other variations will be apparent to those of skill in the art in light of the disclosure herein. Further, while the disclosure herein sets forth several examples of suitable apparatuses and environments for executing the processes, implementations herein are not limited to the particular examples shown and discussed.

Figure 18:
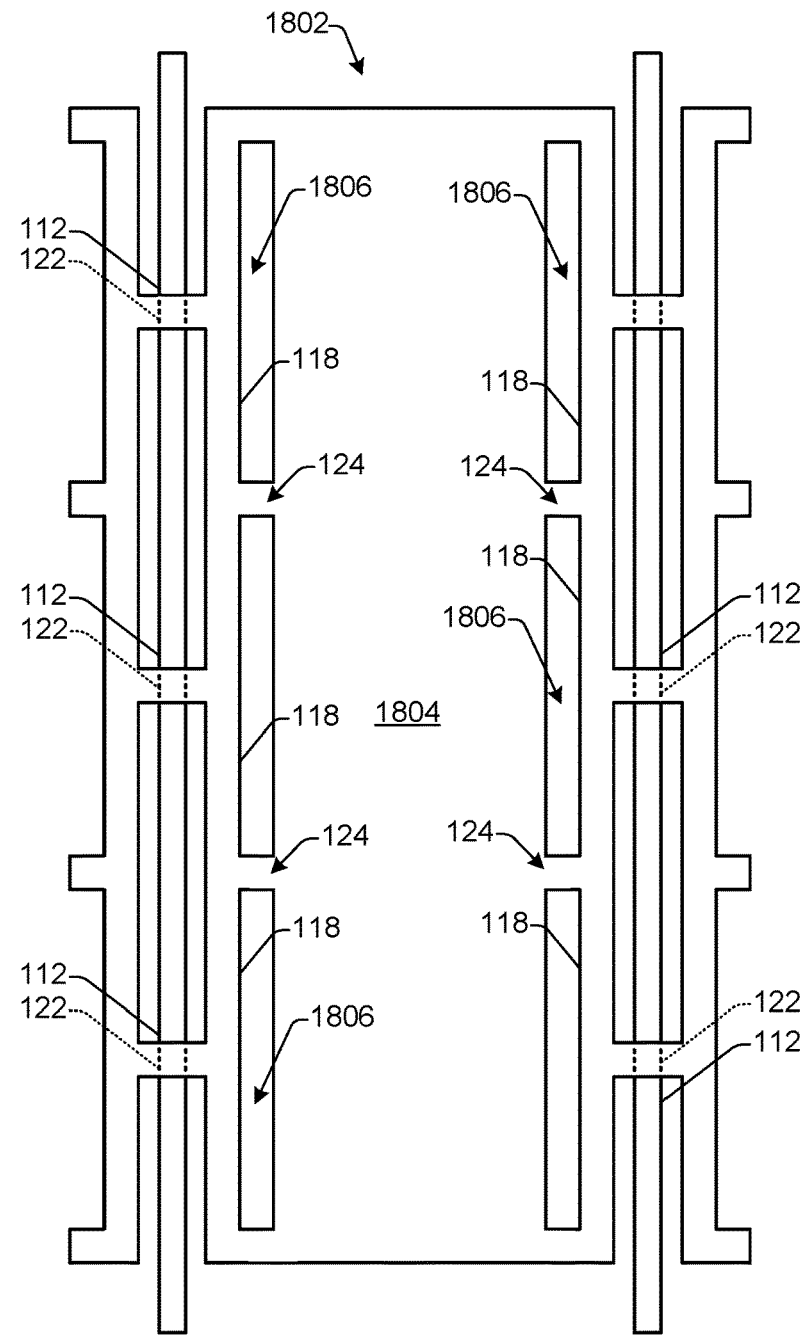
FIG. 18 illustrates an example transducer apparatus according to some implementations.

FIG. 18 illustrates an example transducer apparatus 1800 according to some implementations that may operate similarly to the various implementations of the transducer apparatus 100 discussed above. For example, rather than having cells of a substantially square shape, as discussed above with respect to FIGS. 1-8, the cells can be fabricated to have various other suitable shapes, such as an elongate rectangle, similar to the example of FIG. 9. In this example, the transducer apparatus 1800 includes a cell 1802 that comprises an elongate rectangular plate 1804 that extends past multiple spring junctions 122 and connector elements 124 that connect the spring members 118 to the plate 1804. Accordingly, a plurality of elongate openings 1806 may be formed between the plate 1804 and adjacent plates (not shown in FIG. 18) to define the plate 1804 and to define the spring members 118. Further, in this example, the anchors 112 may be wall-shaped anchors that run underneath the spring junctions 122. In some cases, the anchors 112 may be formed from the same wafer as the plate, and therefore may be contiguous with the material of the plate 1804. In other examples, the anchors 112 may be formed from the substrate over which the plate 1804 is disposed (not shown in FIG. 18). Additionally, in other examples, post-type anchors may be used with the configuration of FIG. 18, rather than wall-type anchors. Further, while the layer of sealing material is not shown in this example, the sealing material may be applied before or after the openings 1806 are fabricated to seal the cavity under the plate 1804, as discussed above. The transducer apparatus 1800 of FIG. 18 may be operated in a manner similar to that discussed above with respect to the transducer apparatus 100.

Figure 19:
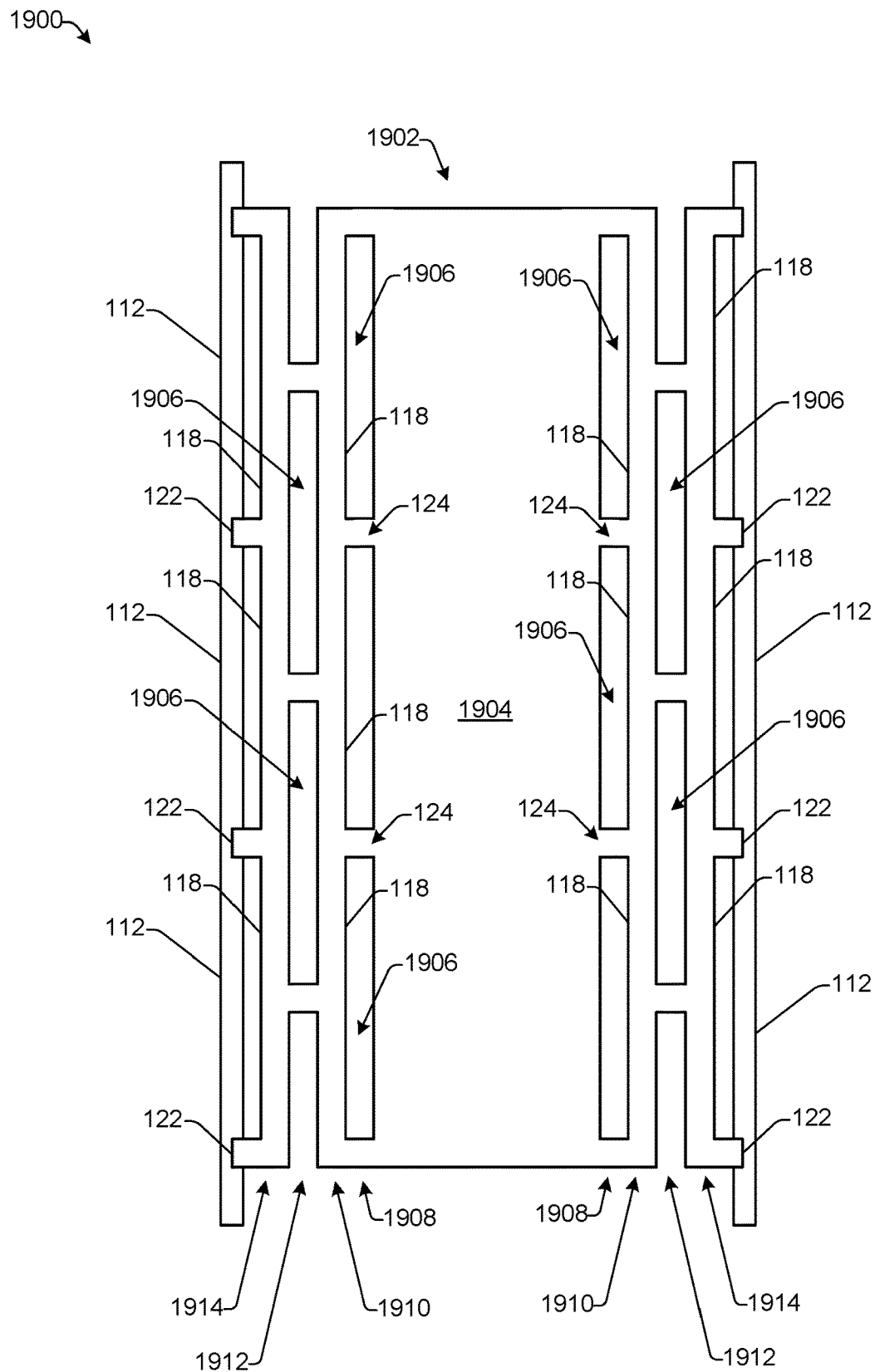
FIG. 19 illustrates an example transducer apparatus according to some implementations.

FIG. 19 illustrates an example transducer apparatus 1900 according to some implementations that may operate similarly to the various implementations of the transducer apparatus 100 discussed above. For example, similar to the example of FIG. 18, in this example, the transducer apparatus 1900 includes a cell 1902 that comprises an elongate rectangular plate 1904 that extends past multiple spring junctions 122 and connector elements 124 that connect the spring members 118 to the plate 1804. Further, in the example, of FIG. 19, the cell 1902 includes multiple spring members 118 in series. Accordingly, a plurality of elongate openings 1906 may be formed in a first row 1908 between the plate 1904 and adjacent plates (not shown in FIG. 19) to define the plate 1904 and to define a first row 1910 of the spring members 118. A second row 1912 of elongate opening 1906 may also be formed to define a second row 1914 of spring members 118. For instance, the configuration of FIG. 19 may allow a larger displacement of the plate 1904 than, for example, the configuration of FIG. 18.

Further, in this example, the anchors 112 may be wall-shaped anchors that run underneath the spring junctions 122. In some cases, the anchors 112 may be formed from the same wafer as the plate, and therefore may be contiguous with the material of the plate 1904. In other examples, the anchors 112 may be formed from the substrate over which the plate 1904 is disposed (not shown in FIG. 18). Additionally, in other examples, post-type anchors may be used with the configuration of FIG. 19, rather than wall-type anchors. Further, while the layer of sealing material is not shown in this example, the sealing material may be applied before or after the openings 1906 are fabricated to seal the cavity under the plate 1804, as discussed above. The transducer apparatus 1900 of FIG. 19 may be operated in a manner similar to that discussed above with respect to the transducer apparatus 100.

Although the subject matter has been described in language specific to structural features and/or methodological acts, the subject matter defined in the appended claims is not limited to the specific features or acts described above. Rather, the specific features and acts described above are disclosed as example forms of implementing the claims.

What is claimed is:

1. A method of fabricating a transducer comprising:
disposing a plurality of anchors on a first substrate or a second substrate;
joining the first substrate and the second substrate by the plurality of anchors to form a cavity, wherein one of first substrate or the second substrate comprises a sealing material and a device layer, the sealing material at least partially sealing the cavity; and
forming, in the device layer of the one of the first substrate or the second substrate, a plate and at least one spring member, wherein the at least one spring member is supported by at least one anchor of the plurality of anchors, and the at least one spring member supports the plate to allow relative movement between the plate and the other one of the first substrate or the second substrate, wherein:
forming the plate and the at least one spring member comprises forming at least one opening between the plate and the at least one spring member; and
the sealing material seals the at least one opening.

2. The method as recited in claim 1, further comprising:
forming a plurality of the plates side-by-side to form a plurality of transducer cells, each transducer cell comprising a respective plate; and
sealing at least a perimeter of the plurality of transducer cells with the sealing material.

3. The method as recited in claim 1, further comprising:
forming a plurality of the plates side-by-side to form a first plurality of the transducer cells as a first array element and a second plurality of the transducer cells as a second array element; and
sealing a first perimeter of the first array element, and sealing a second perimeter of the second array element.

4. The method as recited in claim 1, further comprising:
forming a plurality of the plates side-by-side to form a plurality of transducer cells, each transducer cell comprising a respective plate and a respective cavity; and
sealing the plurality of transducer cells, wherein individual cavities corresponding to respective transducing cells are sealed from other cavities of adjacent transducing cells.

5. The method as recited in claim 1, wherein the sealing material includes a flexible film, the method further comprising disposing the flexible film under the device layer.

6. The method as recited in claim 1, wherein the sealing material includes a flexible film, the method further comprising disposing the flexible film over the device layer.

7. The method as recited in claim 1, further comprising:
at least one of forming the substrate from a conductive material or depositing an electrode layer on the substrate, wherein the substrate includes a first electrode; and
at least one of forming the plate from a conductive material or depositing an electrode layer on the plate, wherein the plate includes a second electrode.

8. A method of fabricating a transducer comprising:
disposing a plurality of anchors on a substrate;
disposing a sealing material and a device layer over the anchors and the substrate to form a cavity, the sealing material at least partially sealing the cavity; and
forming, in the device layer, a plate and at least one spring member, wherein the at least one spring member is supported by at least one anchor of the plurality of anchors, and the at least one spring member supports the plate to allow relative movement between the plate and the substrate, wherein:
forming the plate and the at least one spring member comprises forming at least one opening between the plate and the at least one spring member; and
the sealing material seals the at least one opening.

9. The method as recited in claim 8, wherein the sealing material includes a flexible film disposed at least one of over the plate or under the plate.

10. The method as recited in claim 8, further comprising:
forming a plurality of the plates side-by-side to form a plurality of transducer cells, each transducer cell comprising a respective plate; and
sealing at least a perimeter of the plurality of transducer cells with the sealing material.

11. A method of fabricating a transducer comprising:
disposing a plurality of anchors on one of a first substrate or a second substrate;
joining the first substrate and the second substrate by the plurality of anchors to form a cavity, wherein one of first substrate or the second substrate comprises a sealing material and a device layer, the sealing material including a film as a sealing layer that at least partially seals the cavity to inhibit gas or liquid from passing into or out of the cavity; and
forming, in the device layer of the one of the first substrate or the second substrate, a plate and a plurality of spring members, wherein each spring member of the plurality of spring members is supported by at least one anchor of the plurality of anchors, and the plurality of spring members support the plate to allow relative movement between the plate and the other one of the first substrate or the second substrate, wherein:
forming the plate and the plurality of spring members comprises forming at least one opening between the plate and the plurality of spring members; and
the sealing material seals the at least one opening.

12. The method as recited in claim 11, further comprising:
forming a plurality of the plates side-by-side to form a plurality of transducer cells, each transducer cell comprising a respective plate; and
sealing at least a perimeter of the plurality of transducer cells with the sealing material.

13. The method as recited in claim 11, further comprising:
forming a plurality of the plates side-by-side to form a first plurality of the transducer cells as a first array element and a second plurality of the transducer cells as a second array element; and
sealing a first perimeter of the first array element, and sealing a second perimeter of the second array element.

14. The method as recited in claim 11, further comprising:
forming a plurality of the plates side-by-side to form a plurality of transducer cells, each transducer cell comprising a respective plate and a respective cavity; and sealing the plurality of transducer cells, wherein individual cavities corresponding to respective transducing cells are sealed from other cavities of adjacent transducing cells.

15. The method as recited in claim 11, the method further comprising disposing the film as a flexible film at least one of over the device layer or under the device layer.

16. The method as recited in claim 11, the method further comprising disposing the film as a flexible film that is more flexible than the plurality of spring members to allow the plate to vibrate to at least one of transmit or receive ultrasound energy.

17. The method as recited in claim 11, further comprising:
at least one of forming the substrate from a conductive material or depositing an electrode layer on the substrate, wherein the substrate includes a first electrode; and
at least one of forming the plate from a conductive material or depositing an electrode layer on the plate, wherein the plate includes a second electrode.

\* \* \* \* \*